United States Patent
Keys, Jr.

(10) Patent No.: US 9,143,423 B2
(45) Date of Patent: Sep. 22, 2015

(54) JESD TEST SEQUENCER GENERATOR

(71) Applicant: ANALOG DEVICES, INC., Norwood, MA (US)

(72) Inventor: Kenneth J. Keys, Jr., Tilton Falls, NJ (US)

(73) Assignee: ANALOG DEVICES, INC., Norwood, MA (US)

( * ) Notice: Subject to any disclaimer, the term of this patent is extended or adjusted under 35 U.S.C. 154(b) by 147 days.

(21) Appl. No.: 13/938,030

(22) Filed: Jul. 9, 2013

(65) Prior Publication Data

US 2015/0016272 A1    Jan. 15, 2015

(51) Int. Cl.
*H04L 12/26*    (2006.01)
*H04L 29/06*    (2006.01)

(52) U.S. Cl.
CPC .............. *H04L 43/18* (2013.01); *H04L 43/00* (2013.01); *H04L 69/08* (2013.01)

(58) Field of Classification Search
None
See application file for complete search history.

(56) References Cited

U.S. PATENT DOCUMENTS 7,366,961 B1 *  4/2008  Kovacevic et al. ............ 714/701
2008/0222452 A1 *  9/2008  Kirchhoff ........................ 714/27
2013/0249719 A1 *  9/2013  Ryan .............................. 341/118
2013/0336656 A1 * 12/2013  Belansky et al. ............... 398/79
2014/0023048 A1 *  1/2014  Vu et al. ......................... 370/336
2014/0334312 A1 * 11/2014  Rivingston et al. ........... 370/241
2015/0016471 A1    1/2015  Keyes, Jr. et al.

OTHER PUBLICATIONS

Xilinx, Product Specification, LogiCore IP JESD204 (v1.1), Ds814 Oct. 19, 2011, www.xilinx.com. 6 pages.

* cited by examiner

*Primary Examiner* — Chirag Shah
*Assistant Examiner* — Suk Jin Kang

(57) ABSTRACT

A framer interfacing between one or more data converters and a logic device is disclosed. The framer comprises a transport layer and a data link layer, and the framer is configured to frame one or more samples from the data converters to frames according to a serialized interface. In particular, the synthesis of the hardware for the framer is parameterizable, and within the synthesized hardware, one or more software configurations are possible. Instance parameters used in synthesizing the framer may include at least one of: the size of the input bus for providing one or more samples to the transport layer, the total number of bits per converter, and the number of lanes for the link. Furthermore, a transport layer test sequence generator for inserting a test sequence in the transport layer is disclosed.

20 Claims, 15 Drawing Sheets

JESD TEST SEQUENCER GENERATOR

RELATED APPLICATIONS

This application is related to U.S. patent application Ser. No. 13/937,903, filed Jul. 9, 2013, entitled "CONFIGURABLE QUAD BYTE FRAMER" the disclosure of which is considered part of and is incorporated by reference in the disclosure of this application.

TECHNICAL FIELD OF THE DISCLOSURE

The present disclosure relates generally to interfacing between data converters and logic devices, and, more particularly, to the providing a framer for framing data samples from the data converters according to a serialized interface.

BACKGROUND

Present day digital circuit applications often involve analog-to-digital data converters (ADCs), which includes sampling circuitry that samples an analog input signal at points in time, and then converts the samples to digital values to create a digital signal. The use of ADCs is common for certain types of applications, which can involve receiving an input signal or input data represented by an analog signal, and then converting the analog signal to a digital signal for further processing by a logic block in a digital form. To provide the samples to the logic block, a serialized interface according to a format is often used. Specifically, data samples are organized as frames according to the serialized interface, and the frames are transmitted serially over one or more lanes to a logic block. In one example, a transmitter is provided with a framer, which interfaces between (analog-to-digital) data converters and a logic block.

One example of a serialized interface is the JESD204x series of standards, which defines a serialized interface between data converters and logic devices, written by the JEDEC Solid State Technology Association. For instance, the JESDC Solid State Technology Association has written a JESD204A standard in April 2008, and a JESD204B standard in July 2011. The JESD204B standard in particular defines a large range of possible specifications for a serial link (e.g., having different number of data converters, sample resolutions, and number of lanes). Furthermore, the standard defines a framing protocol for a range of specifications having different frame sizes and samples per frame.

Each application may have a different specification, where a particular specification may include a particular number of data converters, a particular number of links available for the logic block, a particular number of bits per converter, a particular number of samples per converter per frame, etc. Depending on the application, a designer would design circuits for the framer specific to the specification. The design process is time consuming and difficult. Moreover, the designer should have an in depth knowledge of the serialized interface and the format that the interface uses to design a suitable circuit.

OVERVIEW

The disclosure relates generally to a framer supporting a serial interface standard for data converters defined by the JEDEC Solid State Technology Association. Generally, the framer may be used in high speed (e.g., 8 Gb/s, 12.5 Gb/s or higher) analog-to-digital converter applications.

Framer

The present disclosure relates generally to a framer for interfacing between one or more data converters and a logic device, wherein the synthesis of hardware for the framer is defined by one or more parameters. In other words, the hardware can be synthesized to support different specifications defined by the parameters. Furthermore, by using different values for the parameters, the synthesized hardware may result in varying logic gates and circuits having different characteristics such as size, area, and/or power consumption.

In the context of this disclosure, it is noted that the one or more parameters may be defined in a register transfer level (RTL) description using a hardware description language (HDL) such as Verilog or VHSIC Hardware Description Language (VHDL). The synthesis of hardware defined by one or more parameters may occur in different ways. In a first instance, the hardware, i.e., a chip such as a Field Programmable Gate Array (FPGA) already exists. The RTL description includes the one or more parameters. The FPGA is then configured (i.e., through logic synthesis) according to the RTL description. The one or more parameters would dictate how much of the FPGA is utilized and how the FPGA should be synthesized/configured. In a second instance, the hardware has not been built or generated yet. A fabrication entity receives the RTL description, which includes the one or more parameters. Based on the RTL description, an application-specific integrated circuit (ASIC) is built/generated, e.g., synthesized using templates or designs for basic building blocks. The one or more parameters would dictate how much hardware is generated.

One of the many advantages of such a parameterizable framer obviates the need for a designer to implement the framer from scratch. The parameters, e.g., hardware instance parameters, may include at least one of: a total number of bits per converter, a number of lane(s), and a size of an input bus for providing the one or more samples from the one or more data converters. Based on the one or more parameters, the framer is configured to support a specification defined by at least one of: a number of data converter(s), a number of sample(s) per converter, the total number of bits per converter, the number of lane(s), and a frame size. The framer may be configured to support more than one specification, where one specification may be selected as the active configuration through software configuration.

The framer comprises a transport layer and a data link layer. The transport layer configured to map one or more samples from the one or more data converters into one or more frames in a frame memory. The data link layer configured to provide the one or more frames over one or more lanes to a logic device according to a serialized interface. The transport layer provides the key mechanism for mapping samples to frames and frames to lanes. Each lane is then processed by the data link layer to provide frames over the lanes according to the serialized interface.

A parameterizable framer allows a designer to instantiate/synthesize hardware for a framer based on a set of instance parameters, and further configure the framer through software configuration. The architecture provided by the framer enables flexibility in using the framer for a large variety of applications without having to waste resources in designing a specific framer for the specific application. Advantageously, the active specification of the framer can be changed from one to another though software configuration to further increase flexibility of the synthesized hardware.

In one embodiment, the framer is further software configurable via one or more input signals to the framer to change the active specification for at least one of: the total number of bits per converter, the number of data converter(s), the number of sample(s) per converter, and the number of lane(s). Software configurability provides the option for using the framer under different modes (i.e., different link configurations/specifications) within the synthesized hardware provided by the instance parameters In one embodiment, the framer is a quad-byte framer configured to process four octets in parallel. The framer thus outputs four consecutive 10-bit encoded symbols per lane to the logic device in one clock cycle. The framer operates at a clock rate that is 1/40 of the serial link rate of the one or more lanes. The reduction of the clock rate is particularly useful for configuring the framer on programmable hardware, which runs at a relatively slower clock rate while achieving comparable data link rates.

In one embodiment, the one or more parameters further include a first alternate number of bits per converter. The framer is software configurable via an input signal adapted to select one of the total number of bits per converter, and the first alternate number of bits per converter, for use as the active specification of the framer. Such a framer may support multiple (link) specifications within the synthesized hardware, and a selector input may be used advantageously (i.e., via software configuration) to select which mode or active specification the framer should operate.

In one embodiment, one or more multiplexers between the transport layer and the data link layer, the one or more multiplexers adapted to provide the one or more frames in the lower numbered lane(s) if the frame size is increased to a value 8 or greater. The multiplexers advantageously provide the means to conveniently parse the frames to the lower contiguous lanes when the number of active lanes can be reduced (e.g., when the frames in frame memory can be parsed onto fewer active lanes due to an increase in frame size).

A method for providing a framer suitable for interfacing between one or more data converters and a logic device based on one or more parameters is disclosed. One or more non-transitory tangible media that includes code for execution and when executed by a processor is operable to perform operations to provide a framer through synthesis is also disclosed. The method and the code are related to steps for providing the hardware for the framer through synthesis in accordance with the parameters.

Transport Layer Test Sequence Generator

The present disclosure also relates to an apparatus for verifying the compliance of a framer, wherein the framer is configured to interface between one or more data converters and a logic device and to provide a plurality of frames to the logic device according to a serialized interface. The present disclosure also relates to the synthesis of the apparatus. The apparatus includes a transport layer test sequence generator, and the synthesis of the transport layer test sequence generator is parameterizable through one or more parameters. The transport layer test sequence generator is configured to support a specification used by the framer.

The transport layer test sequence generator adapted to replace one or more samples from the one or more data converters with a transport layer test sequence. The transport layer test sequence generator may be synthesized based on a specification of the framer including at least one of: a number of bits per converter, a number of data converter(s), and a number of sample(s) per converter per frame. The transport layer test sequence comprises at least one of: one or more converter identifiers, one or more sample identifiers, and a shifted pattern of control bits over the plurality of frames. Advantageously, the synthesis of the transport layer test sequence generator is parameterizable to match the specification supported by the framer for which the test sequence generator is used. This obviates the need for a designer to hardcode the test sequence for a particular application, or to design custom circuits from scratch.

The transport layer test sequence generator comprises a converter identifier generator, a sample identifier generator, and a control bit shifter. These components may be synthesized based on the parameters used for synthesizing the framer. The converter identifier generator and the sample identifier generator each comprise an adder tree. The number of adders in the adder tree is parameterizable based on, e.g., the size of the input bus for providing the data samples to the transport layer. The control bit shifter comprises a shift register and the length of the shift register is parameterizable based on the size of the input bus. A map is provided which puts together the outputs from these components into a transport layer test sequence according to the specification(s) supported by the framer. In one instance, the transport layer test sequence comprises the Long Test Sequence defined in the JESD204B Standard by the JEDEC Solid State Technology Association.

A method for providing an apparatus for verifying the compliance of a framer is disclosed. One or more non-transitory tangible media that includes code for execution and when executed by a processor is operable to perform operations to provide an apparatus for verifying the compliance of a framer, is also disclosed. The method and the code are related to steps for providing the hardware for the apparatus through synthesis in accordance with the parameters.

DESCRIPTION OF THE DISCLOSURE

Figure 1:
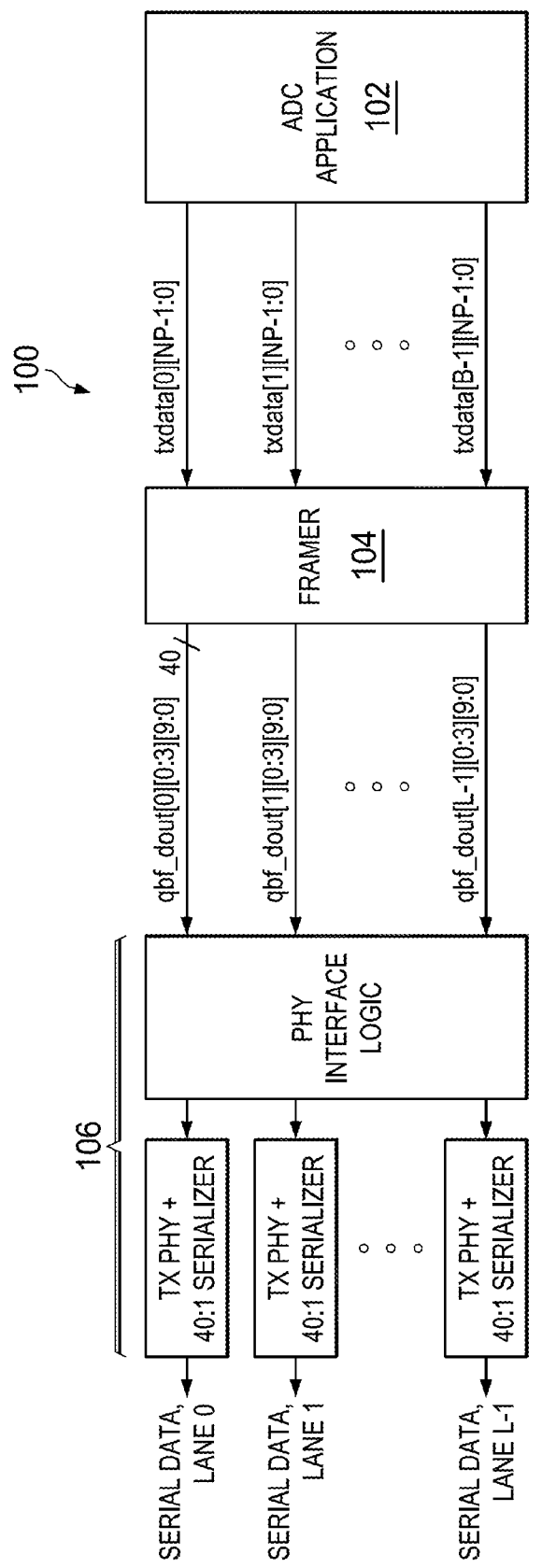
FIG. 1 is a schematic diagram illustrating a transmitter application having a framer according to an embodiment of the disclosure.

FIG. 1 is a schematic diagram illustrating a transmitter application having a framer, according to an embodiment of the disclosure. The transmitter application 100 comprises an analog to digital converter (ADC) application 102, a framer 104, and a physical layer 106. The ADC application typically includes one or more analog-to-digital converters. The output of the ADC application provides one or more samples over, e.g., an input bus "txdata" to the framer 104. The framer processes the samples and provides an output of frames according to a serialized interface over an L number of lanes. The physical layer 106 converts the output from the framer to high-speed serial data over the L lanes.

Typically, a designer may have to design a specific implementation for the framer to support the particular ADC application to frame the one or more data samples into frames according to the serialized interface. The present disclosure proposes a parameterizable framer as its own intellectual property core suitable for performing the functions of a framer for a variety of ADC applications. In particular, the framer has parameters, which are hardware configurable through one or more instance parameters and/or software configurable within the synthesized hardware through one, or more input signals to the framer, such that a designer may simply select an active specification he or she desires for the ADC application. As a result, the framer can be (easily) synthesized in hardware through the one or more instance parameters and software configurable within the hardware to support one or more specifications. To illustrate this concept, a framer capable of being configured for a variety of specifications specified in the JESD204A and JESD204B SubClass 0, 1, and 2 are discussed herein.

Instead of having to design a specific implementation for the framer, a designer can utilize the parameterizable framer and specify the hardware of the framer according to the ADC application. By alleviating this burden, a designer in the product development team can focus on product differentiation rather than spend time learning and implementing the serialized interface. The parameterizable framer provides a common digital platform for a large number of ADC applications requiring a particular serialized interface. Moreover, the use of parameters to allow for different specifications to be supported is easy to use for a designer. The need to understand the specifics of the serial interface standard is obviated. The use of the parameterizable framer provides consistent operation and programming model for all specifications, thereby easing integration, design verification, silicon evaluation, and customer support. Furthermore, a single IP block allows for controlled releases of modifications, enhancements, and bug fixes, and also prevents proliferation of uncontrolled and customized variants of the IP block. By synthesizing only the amount of hardware needed or desired for the framer according to the specified parameters may reduce silicon area and power and/or Field Programmable Gate Array (FPGA) utilization area and power.

One could try to implement the configurable framer entirely in software, but the processing speed of a software implementation may be very limited due to low bandwidth serial links. Such an implementation is provided on a processor that already exists, and any software execution on the processor is utilizing a certain amount of the processor and does not allow the size of the processor to be reduced by (as opposed to synthesizing the amount of hardware needed for the desired specification(s) using the one or more instance parameters). A hardware solution for providing a parameterizable framer is particularly beneficial when a high-speed serial data rate is required for a particular ADC application, e.g., automotive applications, healthcare applications, and communications applications such as set top boxes and XM radio.

In one embodiment, the framer interfaces between one or more data converters (e.g., the ADC application) and one or more logic devices (e.g., through the physical layer 106), wherein the synthesis of hardware for the framer may be specified by one or more parameters. A designer can provide the one or more parameters and synthesize a framer that is configured to support one or more desired specifications.

The framer comprises a transport layer configured to map one or more samples from the one or more data converters into one or more frames in a frame memory. The framer further comprises a data link layer configured to provide the one or more frames over one or more lanes to a logic device according to a serialized interface. For instance, the serialized interface is a serial interface standard for data converters defined by the JEDEC Solid State Technology Association.

A framer may be provided through logic synthesis (configured using programmable hardware or generated using templates), wherein the framer may be synthesized/instantiated through instance parameters (e.g., Verilog instance parameters) to support one or more specifications. The instance parameters may include at least one of: a total number of bits per converter NP, a number of lane(s) L, and a size of the input bus "txdata" B for providing the one or more samples from the one or more data converters. Once synthesized, the framer is further optionally software configurable to change between supported specifications within the synthesized hardware. From these parameters, the framer may support (through software configuration) one or more specifications defined by at least one of: a number of data converter(s) M, a number of sample(s) per converter S, the total number of bits per converter NP, the number of lane(s) L, and a frame size F. The software configurability of the framer enables flexibility for the synthesized hardware to support more than one specification in the processing of the one or more samples, support different number of active (output) lane(s) in the serial link, and support different frame sizes for the serialized interface.

The purpose of the framer is to frame/map one or more samples on the input bus "txdata" from the one or more converters into frames according to a (link) specification. A frame, such as the JESD frame according to the JESD204A/B standard, is a set of consecutive octets in which the position of each octet can be identified by reference to a frame alignment signal. To map the samples to frames, the samples may be arranged into octets, and then into frames. The frame size F is thus the number of octets in a frame. A frame comprises F octets and is transmitted over a single lane.

Figure 2:
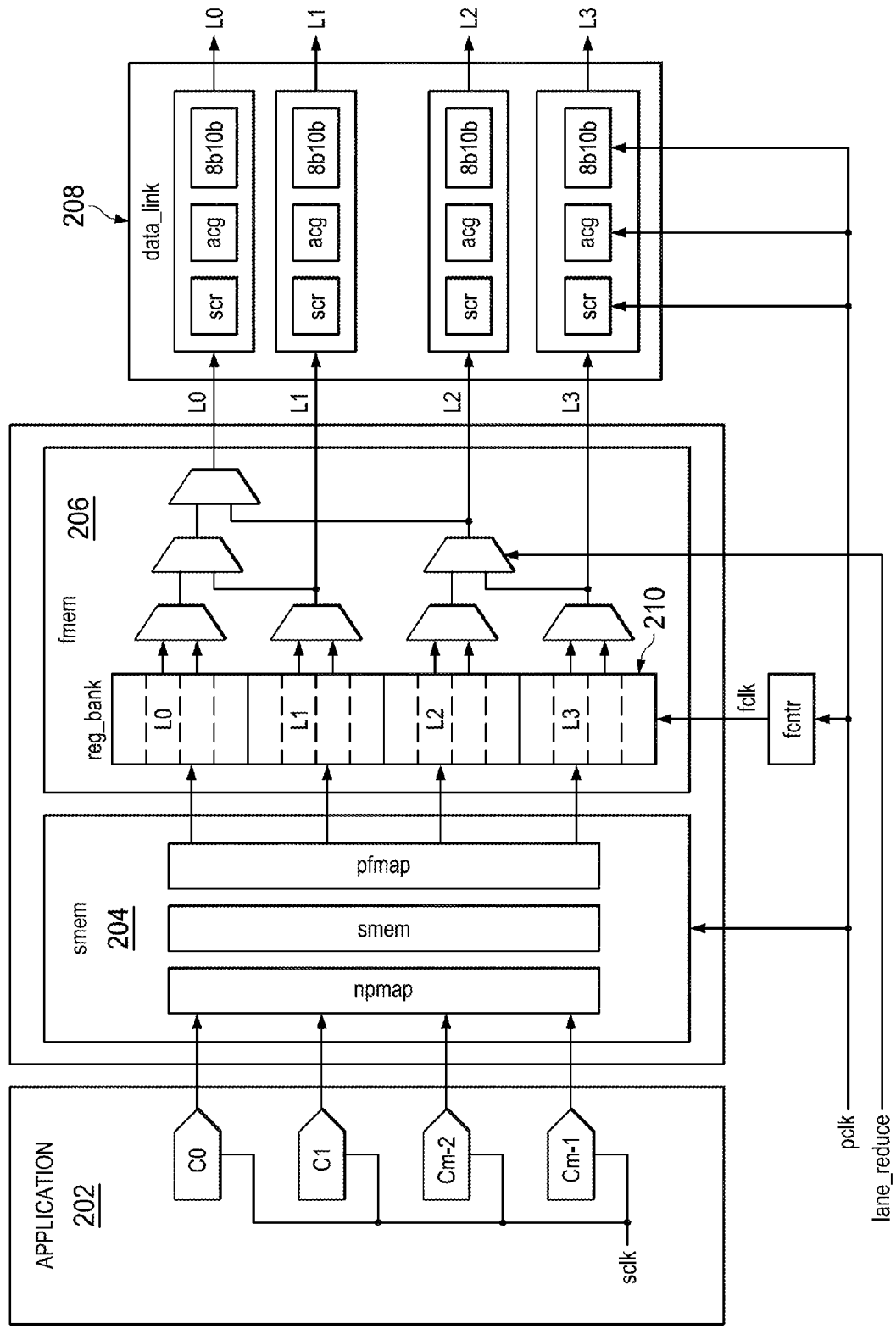
FIG. 2 is a schematic diagram illustrating an application comprising m number of data converters and a framer according to an embodiment of the disclosure.

FIG. 2 is a schematic diagram illustrating an application comprising m number of data converters and a framer according to an embodiment of the disclosure. The framer comprises a "smem" part, an "fmem" part, and a "data_link" part. In this embodiment, the ADC application 202 has m number of converters from C0 to Cm-1. The ADC application 202 is configured to provide one or more samples from the m number of data converters to the "smem" part to organize the input samples into sample memory. The samples in the sample memory are arranged in octets. The samples are then written into "reg_bank" such that the samples are organized by frames in frame memory. During each frame clock period, the frame(s) in "reg_bank" are read and a new frame is dumped into "reg_bank." The "smem" part and the "fmem" part are considered part of a transport layer. The frames are then provided over a number of lanes (e.g., L0-L3). The frames are processed by the "data_link" part, which provides functionalities such as scrambling, alignment character generation, and 8b10b encoding. The "data_link" part is considered part of the data link layer.

The parts seen in FIG. 2 may be synthesized based on instance parameters, such that the size of the sample memory, frame memory, and various components are synthesized for one or more desired specifications (e.g., as needed based on the instance parameters). The instance parameters may include at least one of: a total number of bits per converter NP, a number of lane(s) L, and a size of the input bus B for providing the one or more samples from the one or more data converters. From these parameters, the framer is synthesized to support one or more (link) specifications defined by at least one of: a number of data converter(s) M, a number of sample(s) per converter S, the total number of bits per converter NP, the number of lane(s) L, and a frame size F. In particular, each sample may have a specified number of bits, and the parameterized size of the input bus B allows many permutations of the number of converters M versus number of samples S per converters to be configured. The framer may support specifications where L=1, 2, 4, 6, 8, 10, 12, 14, and 16. The framer may have support specifications where F=1 . . . 8, 16, 32, etc.

To summarize, the framer can be synthesized and/or configured to support a specification which falls within the following ranges of values:

| NP | 1-32 |
|---|---|
| M | 1-256 |
| S | 1-32 |
| L | 1-32 |
| F | 1-256 |

The framer is synchronous to PCLK (as seen as "pclk" in FIG. 2). All clocked paths are single cycle. In one embodiment, the framer 104 is a quad-byte framer, which processes four octets per processing clock PCLK and/or in parallel. Accordingly, the frame memory may organize samples into quad-bytes, then grouped by frames and then group by lanes. Rather than processing one octet per PCLK, processing four octets reduces the clock frequency of the framer to achieve required data rates. In some cases, the processing clock rate can be 312.5 MHz and still meet the data rate required by the JESD standard of up to 12.5 Gbps. Such a clock rate is suitable for Application-Specific Integrated Circuits (ASICs) and Field Programmable Gate Arrays (FPGAs). A quad-byte framer, e.g., outputting four consecutive 10-bit encoded symbols (a 40-bit interface) per lane to the logic device in one PCLK, may operate with a clock rate that is 1/40th of the serial link rate of the one or more lanes (i.e., the data rate).

Depending on the frame size for the serialized interface (e.g., the JESD frame size), the framer may process the one or more samples on the input bus "txdata" for one frame, two frames, or four frames, etc. A variable PF is devoted to indicate a processing frame, i.e., the number of JESD frames processed in parallel, which is determined by the frame size F. If F is 1 octet/frame, a quad-byte framer can process 4 octets/frame (PF=4). If F is 2 octets/frame, a quad-byte framer can process 2 JESD frames (PF=2). If the frame size is 4+octets/frame, a quad byte framer can process 1 JESD frame. If PF=4, F=1, 3, 5, 7. If PF=2, F=2, 6. If PF=1, F=4, 8, 16, 32. Various components are configured to ensure that the pairings of PF and F are supported.

Besides providing configurability in synthesizing the hardware through instance parameters, the framer is also software configurable via one or more input signals to the framer to change the active specification of the framer for at least one of: the total number of bits per converter NP, the number of data converter(s) M, the number of sample(s) per converter S, and the number of lane(s) L.

In certain embodiments, a first alternate number of bits per converter NP1 (or more, such as a second alternate number of bits per converter NP2) may be provided as one or more instance parameters. NP, NP1, and NP2 thus provides one or more "NP modes", all of which are specifications supported by the same synthesized framer. Based on an input signal, e.g., an NP mode selector, the framer may be software configurable to change within the synthesized hardware to support different specifications having NP, NP1, or NP2. Typically, the values for NP, NP1, and NP2 start from the highest value to the lowest (where NP represents the maximum or total number of bits per converter the framer can support). The definition of NP, NP1, and/or NP2 allows appropriate hardware in the "smem" part to be synthesized for the framer to support all of the modes. The input signal (e.g., the NP mode selector), may select/activate the appropriate hardware to process the samples. It is envisioned that 1, 2, 3, 4, 5, etc. NP modes maybe supported. One result of reducing NP through the NP modes is the reduction of lanes, whereby the link efficiency is increased.

| Parameter | Description | Software Configurability |
|---|---|---|
| NP NP1 NP2 | Total number of bits per converter NP1 and NP2 represent additional converter word sizes that can be supported by the same generated hardware. NP, NP1, and NP2 may be specified in a decreasing sequence. Unused values of NP0, NP1, and NP2 may be set to 0. | Yes. NPsel_cfg selects which NP is used for the active specification. |
| L | The number of hardware lanes instantiated | Yes, provided that the software configuration of L (LSW) is less than or equal to the hardware specification of L (LHW) |
| B | Instantiated size of QBF input sample bus txdata = PF * M * S | Yes, provided that software configuration of B (BSW) is less than or equal to the hardware specification of B (BMW) Receiving fewer samples reduces the # of active lanes. |

The frame size F, although a part of the framer's specification, does not have to be specified as an instance parameter, because F may be determined based on NP (NP1, and NP2 as well), B, and L. Accordingly, the hardware having the determined and appropriate F is generated. In some embodiments, the value of F is software configurable by the power of 2.

Processing frames are partitioned on the input bus "txdata" by a specific mapping requirement for the application. All of the one or more samples are captured on a PCLK cycle when "txvld" is active. The maximum number of samples provided to the quad-byte framer per "txvld" is defined by B (the size of the input bus "txdata"=PF*M*S, where PF=1, 2, 4). B also defines the number of samples in the frame memory. The parameter B allows M and S to be programmable/interchangeable. If M is decreased, S may be increased. If M is increased, S may be decreased. Accordingly, the breath of permutations of M and S are software configurable within the synthesized hardware.

Besides M and S, L is also programmable within the synthesized hardware. In one case, if NP is decreased, L may be reduced (such that less lanes is used) when F remains constant. If S is decreased with the same M, L may be reduced when F remains constant. If M is decreased with the same S, L may be reduced when F remains constant. L may also be reduced by a power of 2 if the same M and S are used, but a lower sample rate is used and F may be scaled up by a power of 2. Reduction of lanes provide power saving advantages when some of the lanes may be deactivated. The software configurability allows the same hardware to operate in a mode, which may save power.

The configuration interface may be a wired interface, which may be easily driven by a Serial Peripheral Interface block. The ADC interface, i.e., the input bus, for providing one or more samples to the framer may be a two-dimensional port of B samples [0:B-1][NP-1:0]. All converter samples are written on a single PCLK cycle, and the samples may be for a single frame (PF=1, for a single JESD frame) or multiple frames (PF=2, for two JESD frames or PF=4, for four JESD frames) depending on the frame size F. The link interface, i.e., the output of the framer for providing the one or more frames to the logic device over one or more lanes is a 40-bit interface providing 40-bits per lane[0:L-1][39:0]. The framer maps 0:B-1 Samples to 0:L-1 Lanes.

Referring back to FIG. 2, the data path of the framer may be partitioned in to a transport layer ("smem" part and "fmem" part) and a data link layer ("data_link" part). The transport layer receives "txdata" samples when "txvld"=1. "txvld" occurs once per processing frame (PF) cycle (the timing of "txvld" may be programmed based on PF and F). The "txdata" samples are arranged in octets in the "smem" part and then the octets are mapped to frame memory according to the frame size F in "fmem" for the one or more lanes. An instance block is generated for each lane in the data link layer for processing the frame(s) in the respective lane. Each lane in the data link layer reads from a defined section of the frame memory. In the case of a quad-byte framer, the frames of quad octets in the frame memory is partitioned into 32-bit sections, and 32-bits sections are provided to an instance block in the data link layer for processing.

Figure 3:
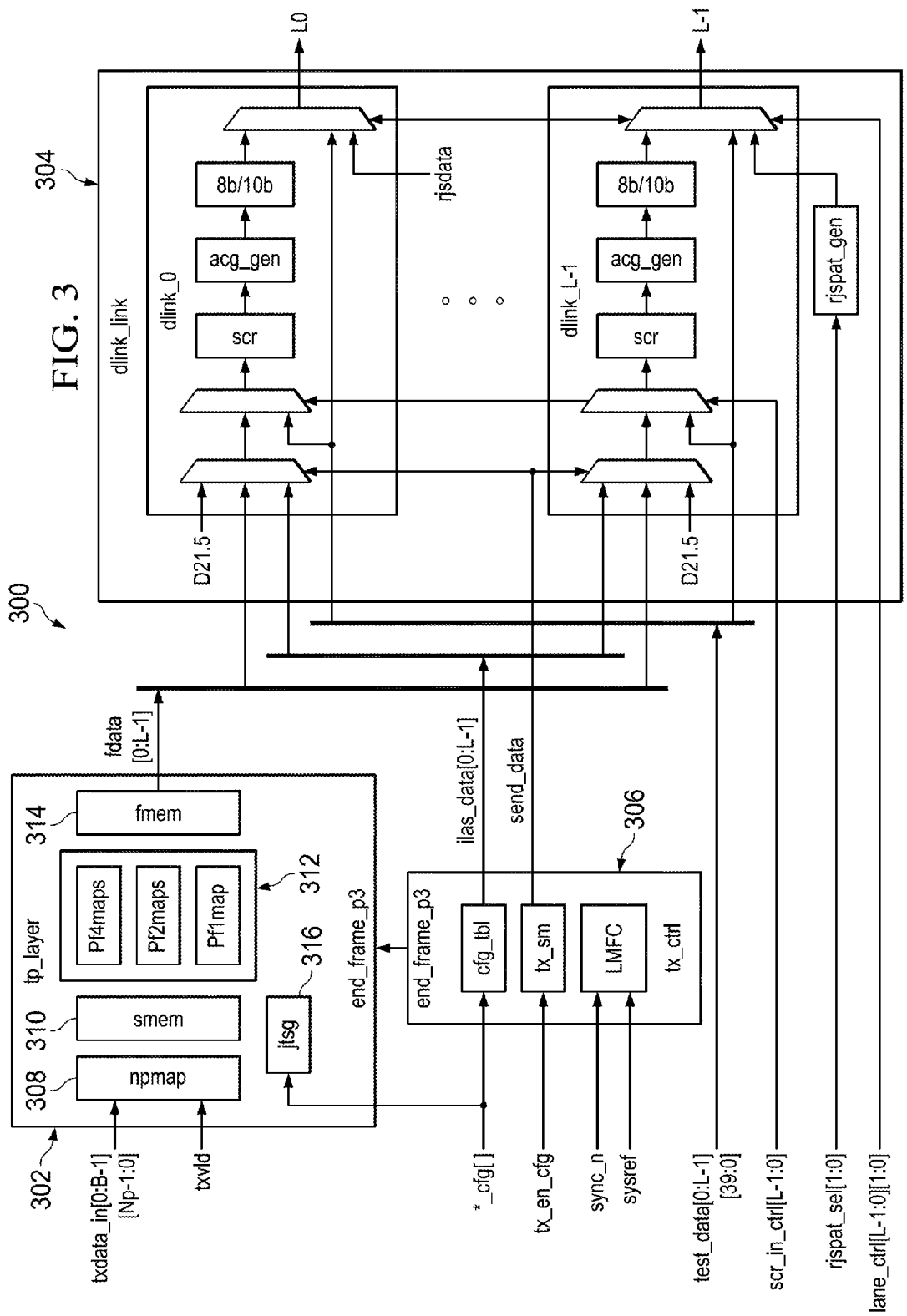
FIG. 3 is a schematic diagram illustrating a framer, according to one embodiment of the disclosure.

FIG. 3 is a schematic diagram illustrating a framer, according to one embodiment of the disclosure. The framer 300 comprises a transport layer "tp_layer" 302, a data link layer "data_link" 304, and a control module "tx_ctrl" 306. To illustrate, the synthesis of the framer "qbf" on programmable hardware may be provided/instantiated using this exemplary code:

```
module qbf
    #(  // instance parameters
        parameter B = 16,  // size of input bus "txdata"
        parameter L =  8,  // number of lane(s)
        parameter NP = 16, // total number of bits per converter
        parameter NP1 = 14, // a first alternate number of bits per converter
        parameter NP2 = 12, // a second alternate number of bits per converter
        // optional instance parameters
        parameter FPGA = 0,
        parameter RLDLK = 1,
        parameter RLFM = 0)
    (
        input            pclk,              // link_clock/40
        input            rst_n,             // master reset
        // LMFC Interface
        input            sysref,            // LMFC Reset
        input            sync_n,            // sync_n request
                                            //   from receiver
        input [3:0]      ilas_delay_cfg,    // Delay ILAS by
                                            //   N LMFC Periods
        input [4:0]      mfcntr_offset_cfg, // LMFC Offset for
                                            //   Multi-frame
                                            //   Count
        input            txvld_sync_en,     // enable external
                                            //   fcntr sync by
                                            //   txvld
        output           lmfc,              // lmfc marker
        output [7:0]     fcntr,             // Frame Counter
        output [4:0]     mfcntr,            // Multi-frame
                                            //   Counter
        // JEDEC Link Configuration
        input [3:0]      bid_cfg,           // Bank ID
        input [4:0]      cf_cfg,            // # ctrl words/
                                            //   frame_clk
        input [1:0]      cs_cfg,            // # ctrl bits/frame/
                                            //   clk
        input [7:0]      did_cfg,           // device id
        input [7:0]      f_cfg,             // # octets/frame
        input            hd_cfg,            // high density
                                            //   mode
        input [4:0]      k_cfg,             // # frames/multi-
                                            //   frame
        input [4:0]      l_cfg,             // # lanes per link
        input [0:L-1][4:0] lid_cfg,         // lane id
        input [7:0]      m_cfg,             // # converters
        input [4:0]      n_cfg,             // # bits per
                                            //   converter
        input [4:0]      np_cfg,            // total bits per
                                            //   sample
        input [4:0]      s_cfg,             // # samples/
                                            //   frame_clk
        input            scr_cfg,           // scrambler on
        input [7:0]      res1_cfg,          // reserved register
                                            //   in cfg. tbl
        input [7:0]      res2_cfg,          // reserved register
                                            //   in cfg. tbl
        input [0:L-1][7:0] chksum_cfg,      // check sum
        input [3:0]      adjcnt_cfg,        // # of adjustment
                                            //   steps
        input            adjdir_cfg,        // direction to adjust
                                            //   dac lmfc
        input            phadj_cfg,         // phase adjustment
                                            //   req to dac
        input [2:0]      subclassv_cfg,     // device subclass
                                            //   version
        input [2:0]      jesdv_cfg,         // jedec version
        input            spare2_cfg,        // spare bits in cfg2
                                            //   reg
        input [1:0]      spare3_cfg,        // spare bits in cfg2
                                            //   reg
        input [2:0]      spare5_cfg,        // spare bits in cfg2
                                            //   reg
        input            spare7_cfg,        // spare bits in cfg2
                                            //   reg
        input [1:0]      spare10_cfg,       // spare bits in cfg2
                                            //   reg
        input [1:0]      npsel_cfg,         // To tp_layer_i0
                                            //   of tp_layer.v
        // Link Control
        input            lsync_en_cfg,      // both sides
                                            //   perform lane
                                            //   sync
        input [7:0]      kf_ilas_cfg,       // # multi-frames
                                            //   in ILAS
```

-continued

| | | | |
|---|---|---|---|
| input | byp_8b10b_cfg, | // | bypass 8b10b encoder |
| input | byp_ilas_cfg, | // | bypass initial lane alignment |
| input | byp_acg_cfg, | // | bypass character replacement |
| input | tx_en_cfg, | // | enable transmit |
| input [L−1:0] | l_en_cfg, | // | L lane on/off control |
| input | del_scr_cfg, | // | delay scrambler option [1= enabled] |
| // Test Control | | | |
| input | ilas_test_en_cfg, | // | Enable repeated ILAS |
| input [L−1:0] | scr_data_sel_cfg, | // | 0=normal data, 1=D21.5 continuous |
| input [L−1:0] | phy_data_sel_cfg, | // | 0=8b10b data, 1=rjspat data |
| input [L−1:0] | scr_in_ctrl_cfg, | // | test data input to scrambler |
| input [L−1:0] | lane_ctrl_cfg, | // | 8b10b output mux, 0=normal data, 1=test_data |
| input [1:0] | rjspat_sel_cfg, | // | select high freq test pat [00=rpat, 10=jspat, 11=jtspat] |
| input | tpl_test_en_cfg, | // | To tx_ctrl_i0 of tx_ctrl.v |
| input | rjspat_en_cfg, | // | turn on rpat/jspat/jtspat generator |
| input [0:L−1][0:3] [9:0] | test_data, | // | test data |
| input | testmode_ignore_syncn_cfg, | // | D21.5 and RPAT test modes ignore sync_n |
| // ADC and PHY Interface | | | |
| input [0:B−1] [Np−1:0] | txdata, | // | array of converter inputs |
| input | txvld, | // | fifo data available |
| output [0:L−1][0:3] [9:0] | qbf_dout, | // | array of lane outputs |
| // Status Port | | | |
| output [3:0] | txsm_state | // | Tx state |
| ); | | | |

The transport layer 302 is configured with one or more sample memory maps "npmap" 308, a sample memory 310, one or more frame memory maps 312, and a frame memory 314. These components are synthesized based on the one or more parameters and may support one or more specifications of the framer. In some embodiments, a transport layer test sequence generator "jtsg" 316 (also parameterizable) is provided in the transport layer 302, such that a transport layer test sequence may replace the data samples in "txdata."

The data link layer 304 comprises L data link instance blocks (dlink_0 to dlink_L-1). The number of the data link instance blocks synthesized for the framer is directly linked to/parameterizable by the parameter L. Each instance block d_link is dedicated for each lane from L0 to L-1, configured to perform functions such as scrambling, alignment character generation, and 8b10b encoding. In some embodiments, a data link layer testing module "rjspat_gen" may be provided for implementing various data link layer test modes. The output from the data link layer testing module may be provided onto each of the lane(s) using one or more multiplexers in each of the instance blocks to replace the frames on the lanes with a test sequence. For instance, a D21.5 test mode may be configured for JESD204B test, where D21.5 characters are sent and inserted continuously at the data link layer for output onto the lane(s). In some other instances, RPAT, JSPAT, JTSPAT test modes (according to the MSQS Specification) are implemented as high frequency test patterns in the data link layer testing module.

The control module 306 provides modules that generates suitable timings and schedules for framing samples, e.g., according to the JESD specification. For instance, a configuration table input "cfg_tbl" may be provided in the control module 306 to store a table of link specifications according to possible parameters. In another instance, a sequencer "tx_sm" may be provided in the control module 306. In yet another instance, a timing generator "LMFC" may provide the suitable calendars for generating appropriate timing for the framer.

Sample Memory Map(s) and Sample Memory

Figure 4A:
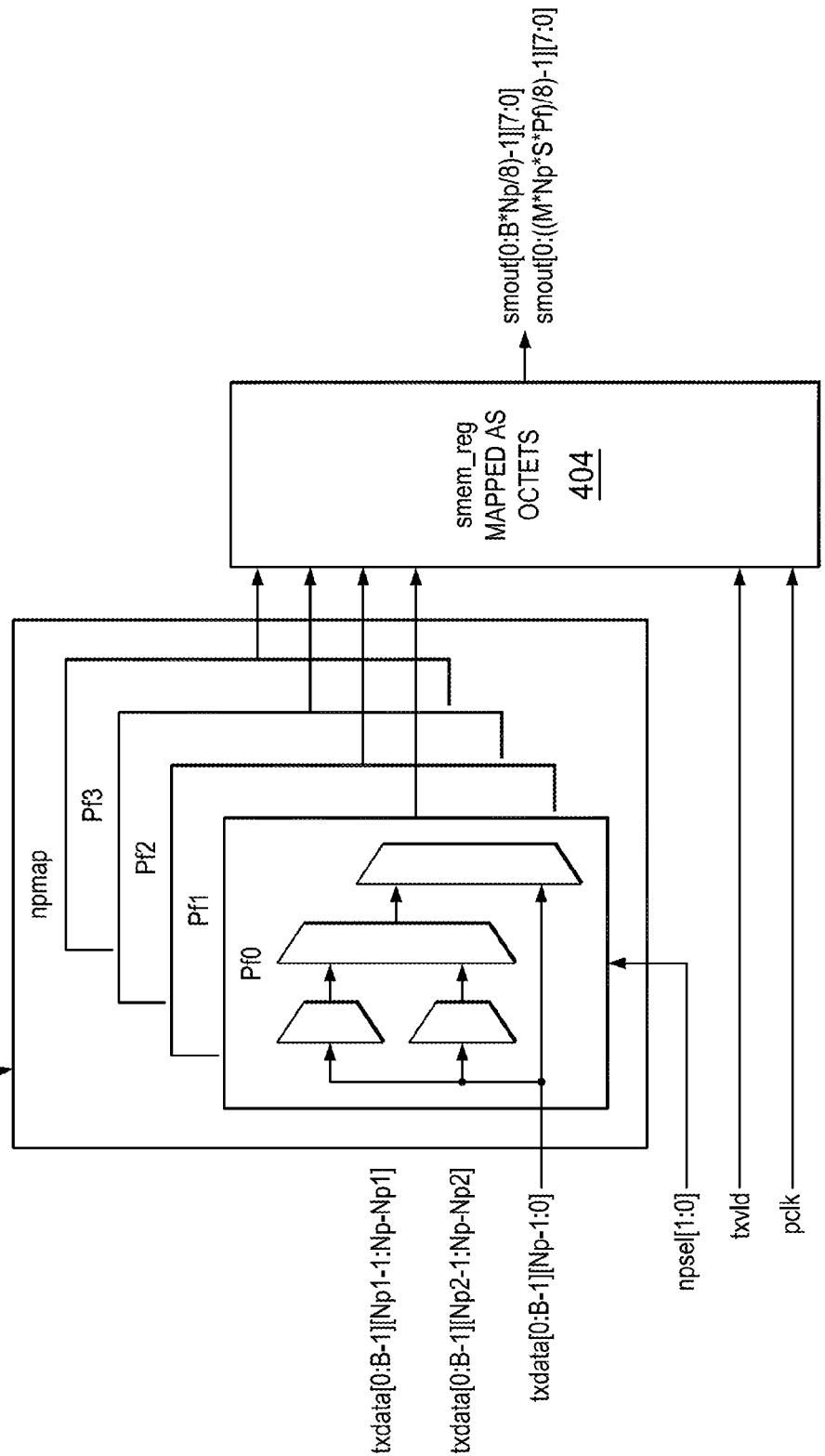
FIG. 4A shows an illustrative map and an illustrative sample memory, according to one embodiment of the disclosure.

FIG. 4A shows an illustrative map and an illustrative sample memory, according to one embodiment of the disclosure. One or more sample memory maps "npmap" 402 are provided to map samples from the input bus "txdata" into a sample memory according to the parameter NP (a total number of bits per converter), wherein the samples in the sample memory are arranged in octets. In one embodiment, a sample memory map comprises a plurality of multiplexers to parse the input samples on the input bus "txdata" into octets in the sample memory "smem_Reg" 404".

In certain embodiments, the framer is software configurable to support a different number of bits per converter. The architecture of the "npmap" is provided such that the number of bits per converter NP is parameterizable. For instance, a first alternate number of bits per converter NP1 and/or a second alternate number of bits per converter NP2 (or more) may be specified as a parameter when the hardware for the framer is synthesized. A different sample memory map (a different set of multiplexers) may be synthesized in hardware to support one or more alternate numbers of bits per converter. An input signal "npsel[1:0]" may then be used to select which sample memory map to use for an active specification of the framer.

Generally speaking, NP, NP1 and NP2 define the number of bits used per "txdata" sample (i.e., number of bits per converter). NP is the default mode that defines the maximum number of bits used per "txdata" sample.

Figure 4B:
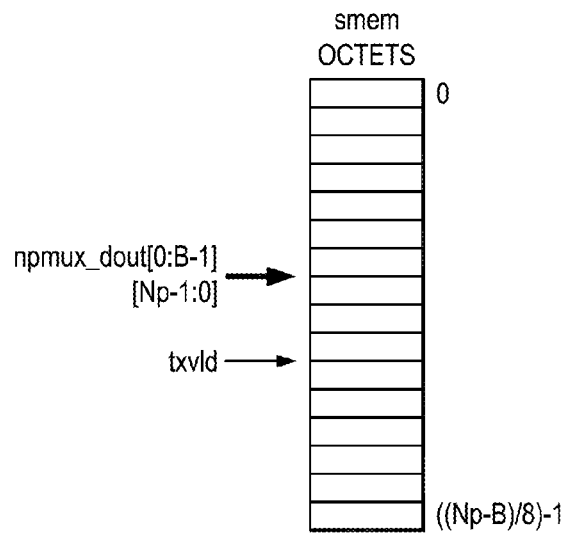
FIG. 4B shows an illustrative sample memory, according to one embodiment of the disclosure.

In some embodiments, the different sample memory map is not synthesized if the parameter NP1 and/or NP2 is set to 0. Typically, NP, NP1, and NP2 are specified in a descending order, such that NP constitutes the maximum/total number of bits per converter the hardware of the framer is configured to support. FIG. 4B shows an illustrative sample memory, according to one embodiment of the disclosure. Based on the parameter NP, a sample memory "smem octets" as shown is generated with a size ((NP−B)/8)−1. It is noted that if NP1 or NP2 (or some other alternate number of bits per converter, less than NP) is selected as the active specification of the framer, not all of the sample memory will be used (some sections will be left unused). When the samples are mapped to a frame memory, not all of the frame memory will be used. Furthermore, the framer would map the frames onto less number of lanes (less than L).

Frame Memory Maps and Frame Memory

Figure 5A:
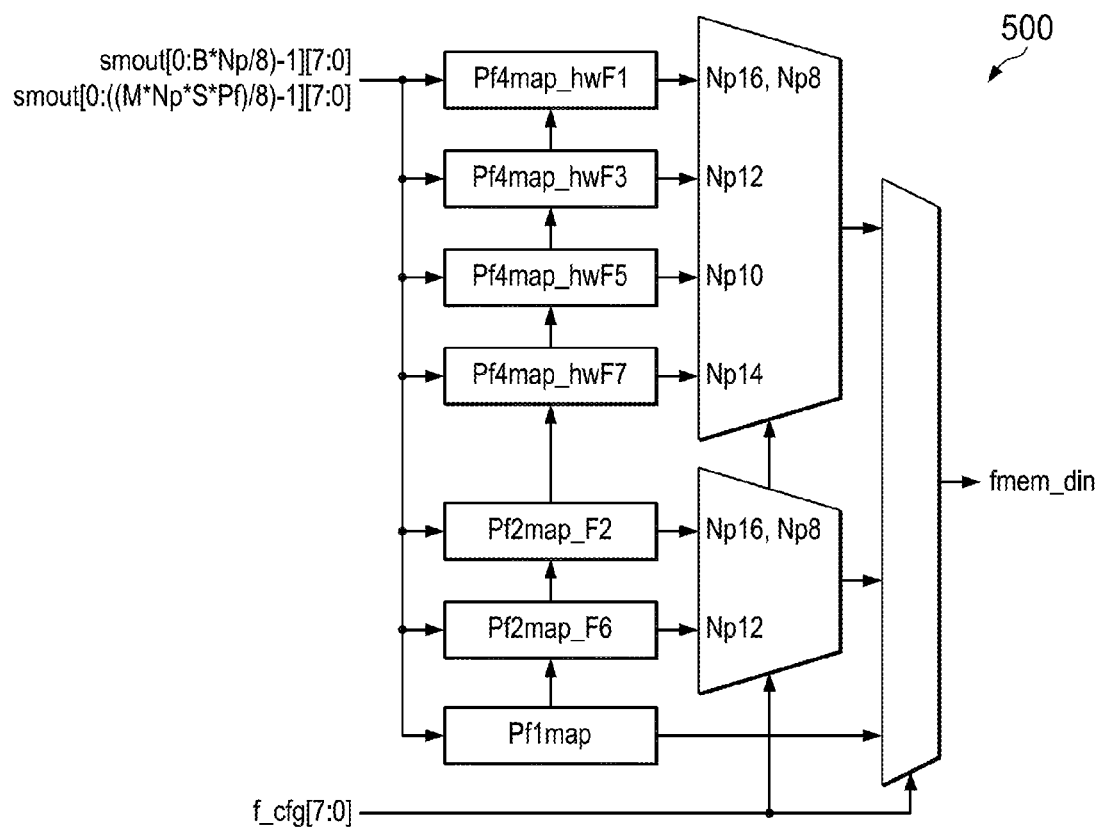
FIG. 5A shows an illustrative map for mapping samples from the sample memory to the frame memory, according to one embodiment of the disclosure.

FIG. 5A shows an illustrative map for mapping samples from the sample memory to the frame memory, according to one embodiment of the disclosure. Once the samples are organized into octets in sample memory, a frame memory map 500 is provided to map the samples in the sample memory into, e.g., quad-bytes in a format ready for readout to the data link layer. For instance, the samples may be organized into frames and the frames are grouped by lanes. In some embodiments, the samples are arranged in quad-bytes in the frame memory. The size of the frame memory (not shown) is determined based on the frame size F and the frame memory is generated accordingly.

Figure 5B:
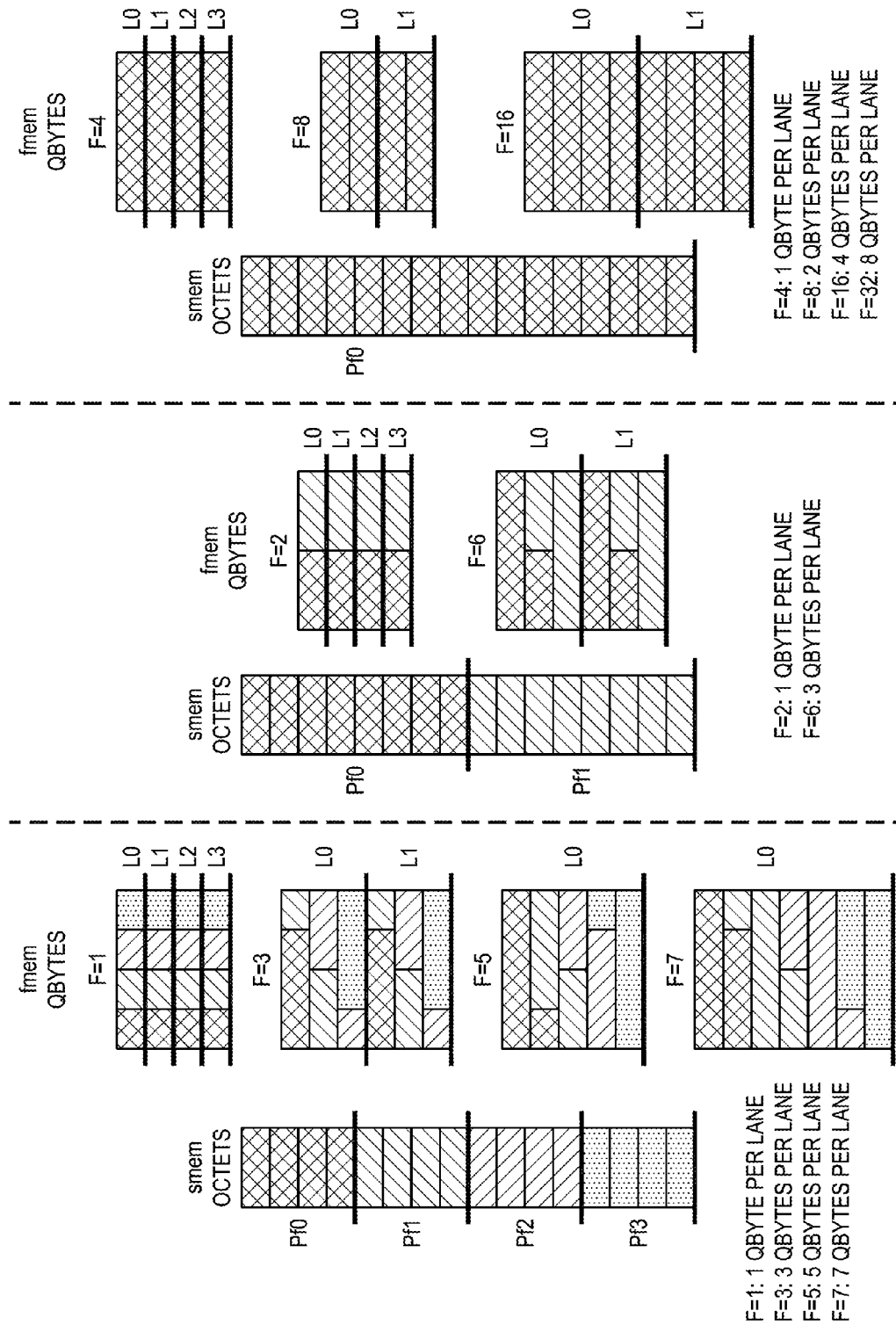
FIG. 5B shows examples for each possible frame memory map and how the frame memory map maps the samples in the sample memory to the frame memory, according to some embodiments of the disclosure.

The frame memory format changes for every frame size below F=8. Therefore, a dedicated map for each frame size F1 to 7 exists. For F=8, 16, and 32, the frame memory controls the quad-byte readout to the data link layer. Depending on the frame size below F=8, a particular map is selected (e.g., based on the corresponding PF) and used for mapping the samples in sample memory into the frame memory. FIG. 5B shows examples for each possible frame memory map and how the frame memory map maps the samples in the sample memory to the frame memory, according to some embodiments of the disclosure. The samples from the input bus are organized by octets using the sample memory map, and grouped according to processing frames. The octets are then mapped to the frame memory, where the frames are arranged by lane(s). In some embodiments, the frame memory is arranged by quad-bytes.

Lane Reduction and Mapping Frames to Less Active Lanes

Because the framer is software configurable within the synthesized hardware to support a different active specification it is possible for the same synthesized framer to support a different active specification where less active lanes may be used. One consequence of using less active lanes may be lower power consumption. There are various ways to reduce the number of lanes. Generally speaking, the framer can provide the one or more frames from the frame memory, over fewer active lanes if a portion of the frame memory is not utilized, if the amount of data samples the framer processes per PCLK decreases (thereby also leading to underutilization of the instantiated frame memory), or if frame size increases.

In some embodiments, it is desired for the one or more frames to be provided over the lower numbered contiguous lane(s) when fewer active lanes are used. In certain embodiments, the provision of the frames in the lower numbered contiguous lanes is handled by one or more multiplexers in the sample memory map and/or frame memory map in the transport layer. In certain embodiments, the provision of the frames in the lower numbered contiguous lanes is provided by one or more multiplexers between the transport layer and the data link layer.

In one embodiment, less active lanes are used when the ADC sampling rate is lowered but the number of data converter(s) M and the number of sample(s) per converter S remain unchanged. For instance, the sampling rate may decrease by a power of two, and thus the sample memory and the frame memory is underutilized by a power of two. As a result, the number of active lanes is also decreased by a power of two. In another embodiment, less active lanes are used when the M and/or S is decreased but the ADC sampling rate remains unchanged. In both of these embodiments, the framer processes less data per PCLK and the frame memory may be underutilized.

In another scenario, the framer can use less lanes if the frame size is increased (also in some case when reducing the number of samples processed by the framer by decreasing the input sampling rate to allow the links to read out the memory slower), when M and S remain the same.

Figure 6A:
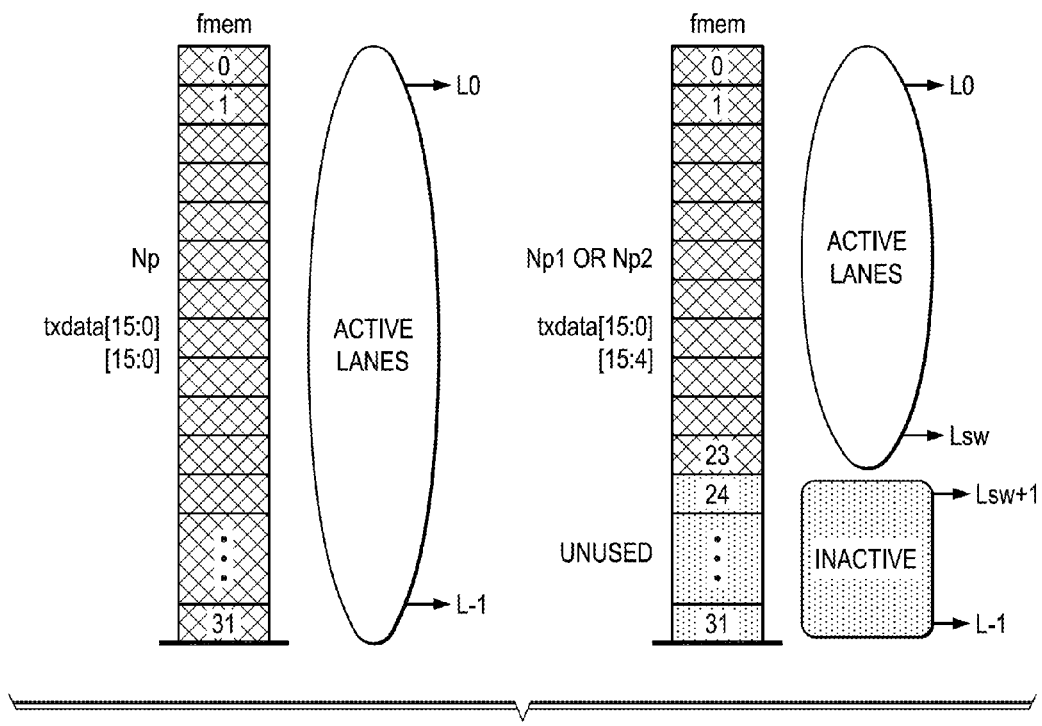
FIGS. 6A-B show various diagrams illustrating different software configurations allowing fewer active lanes being used, according to some embodiments of the disclosure.

FIG. 6A shows two diagrams illustrating different modes allowing fewer bits per converter being used, according to some embodiments of the disclosure. In this instance, the number of active lanes are reduced when less number of bits per converter is used for the active specification of the framer. For instance, the software configuration may select a less/ alternate number of bits per converter (e.g., NP1, NP2) to be used within the synthesized hardware, and leaves a section of the frame memory unused. Using an appropriate frame memory map, the used section of the frame memory can be used to map onto active lanes, and the unused section of the frame memory enables one or more lanes to be "deactivated" or simply to be not used (thereby reducing the number of active lanes). Optionally, the sample memory maps and/or the frame memory maps may be synthesized to ensure that the active lane(s) are in the lower contiguous lane(s) when, e.g., the alternate NP1 and NP2 modes are used. NP1 and NP2 are software selectable modes that allow fewer bits used from each "txdata" sample. Both NP1 and NP2 samples are Most Significant Bit (MSB) justified to NP. NP width "txdata" samples map to the full frame memory bandwidth, NP1 and NP2 txdata samples utilize less frame memory bandwidth, which results in fewer active lanes.

Figure 6B:
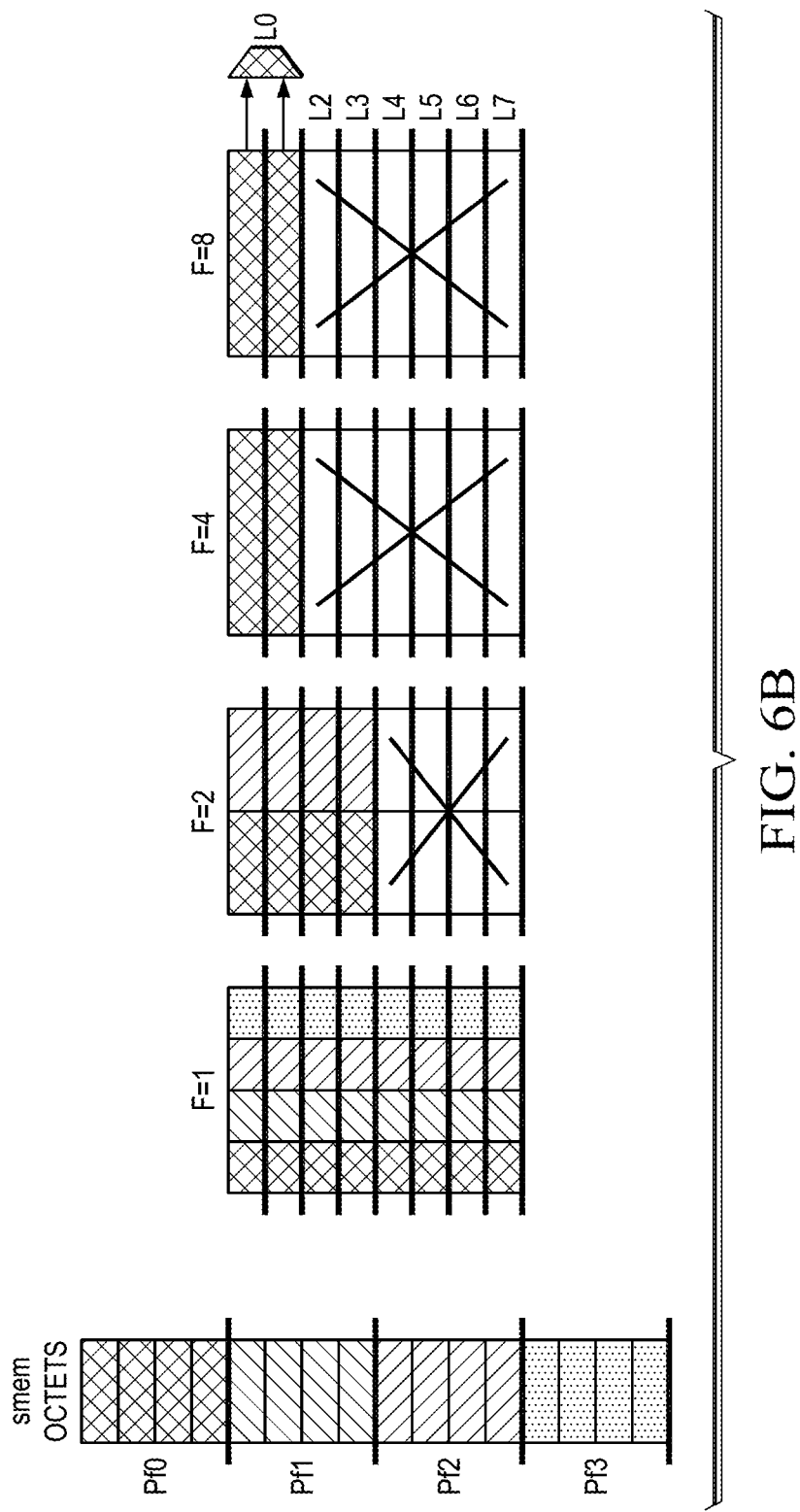

FIG. 6B shows the increase in frame size F leads to unused sections of the sample memory and the frame memory, according to some embodiments of the disclosure. The diagram shows an example of the sample memory and a frame memory for L=8:1 and F=1:8. As shown, the sample memory is organized by octets and grouped by processing frames. The sample memory mapping to the frame memory is shown for varying F in different specifications. The crossed out section of the frame memory represents inactive lanes due to an increase in F (resulting in fewer samples processed by the framer). Using an appropriate frame memory map, the used section of the frame memory can be used to map onto active lanes, and the unused section of the frame memory enables one or more lanes to be deactivated (thereby reducing the number of active lanes).

For instance, FIG. 6B shows progression from F=1, 2, 4, and 8 that for F=2 and F=4 less JESD frames are processed so less frame memory is utilized. But for F=8 and beyond the same number of JESD frames are processed (processed at a lower ADC sampling rate) so the same amount of frame memory is utilized. In some embodiments, where F is increased to a value of 8 or greater, multiplexers (between transport and data link layers) may be provided to remap what frame memory quad octets go to what data link lanes (e.g., if lower contiguous lanes are desired). The multiplexers may take what was previously Lane 1 quad octets for F=1, 2, 4 and remaps it to Lane 0 under frame memory control. The quad octets are then read serially on PCLK.

Figure 7:
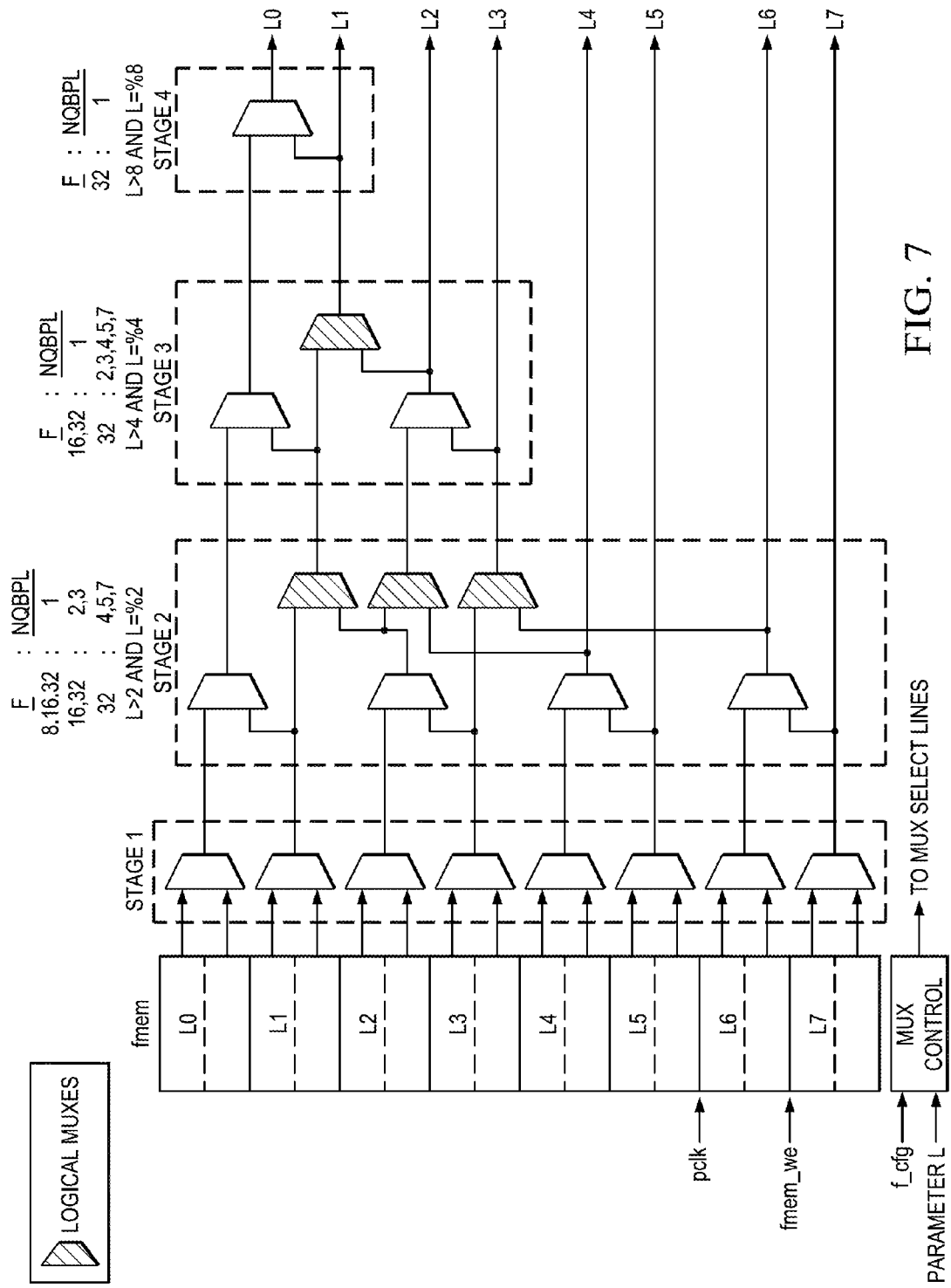
FIG. 7 shows an exemplary implementation of multiplexers for lane reduction, according to an embodiments of the disclosure.

FIG. 7 shows an exemplary implementation of multiplexers for lane reduction, according to an embodiments of the disclosure. To map to fewer active lanes, a plurality of multiplexers may be advantageously provided to map the frames in the frame memory onto lower numbered lanes. The multiplexers are provided in three stages for reading the frames from the frame memory onto one or more (output) lanes. The first stage parses the quad bytes in the frame memory into each lane. The second stage and beyond are power-of-2 multiplexes that perform lane reduction and logical mapping. When F exceeds the number of octets allocated per lane, the Stage 1 multiplexers are parsed by the power-of-2 multiplexers to output frame memory over fewer lanes. The logical multiplexers are optionally provided to remap the power-of-2 lanes to the lowest numbered (contiguous) lanes. The parsing may be repeated with a maximum of four multiplexer stages. The fourth multiplexer stage will yield an F=32 frame size. In some embodiments, these multiplexers may be used to map the frames in frame memory to lower contiguous lanes if the frame size is increased to 8 or greater (through software configuration).

In some embodiments, multiplexers between the transport layer and data link layer enable smaller JESD frames (whose size is defined by frame size F) written to frame memory to be parsed and mapped as larger frames that are transmitted over fewer active lanes. As frame size increases by power of 2, for F>=8, the active lanes reduces by power of 2. The muxes then further remap the larger frames to the lowest contiguous lanes. Generally this feature (embodiment) is enabled in instances where the converter sampling rate decreases by power of 2 and the M*S samples written to QBF remain unchanged (e.g., PF=1 modes). The mapping of smaller frames as larger frames onto less active lanes may be performed whenever the data rate specified for the output lanes may accommodate transmitting the data over fewer active lanes. In other words, the mapping of smaller frames as larger frames onto the lanes may be performed irrespective of whether frame memory is underutilized.

Test Insertion Points and Transport Layer Test Sequence Generator

Various test insertion points may be provided in the framer, and different test sequences may be inserted into the data path at the test insertion points to verify the compliance of the framer. For instance, a test insertion point may reside in the transport layer and/or the data link layer.

Figure 8:
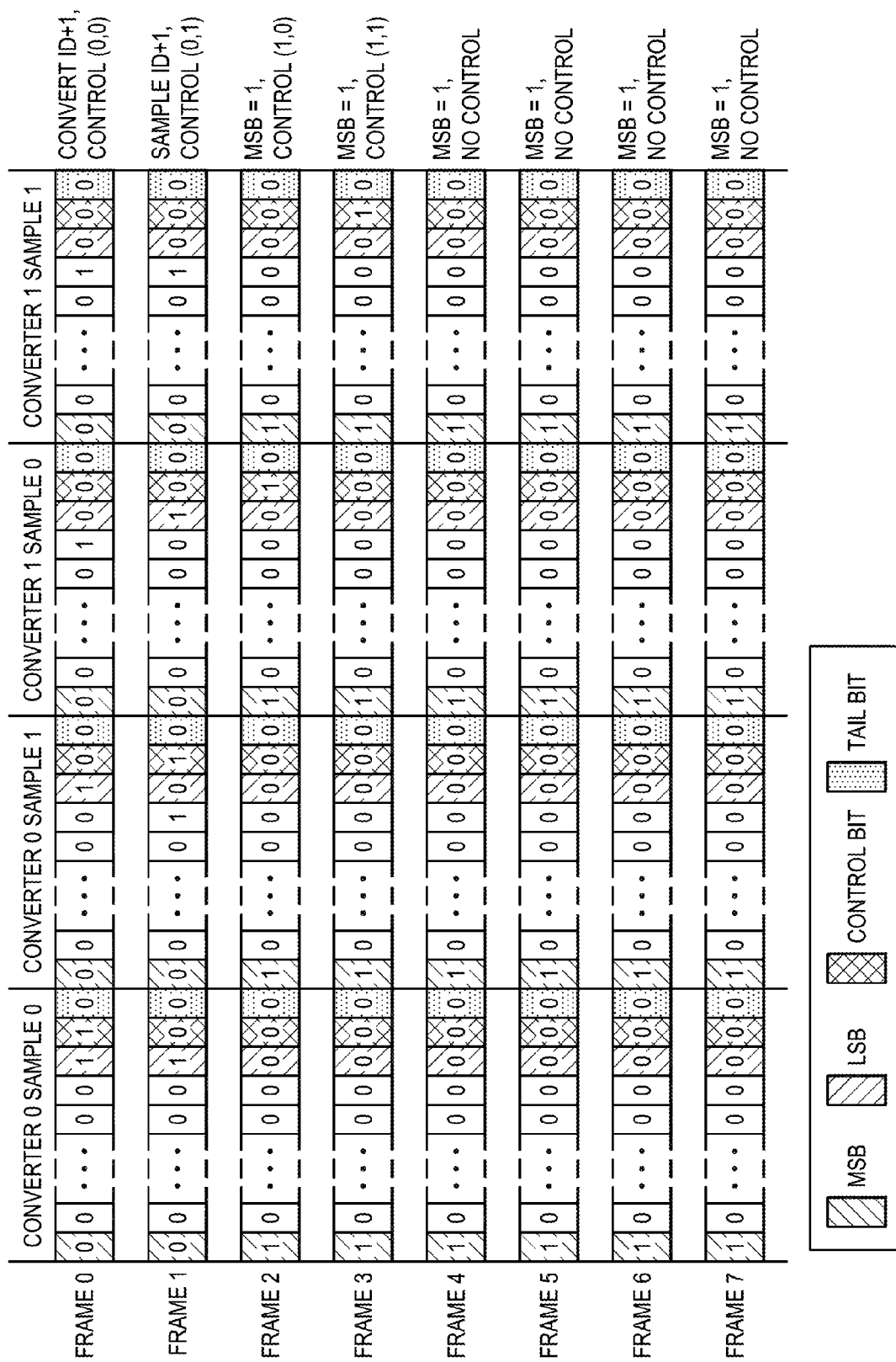
FIG. 8 shows an illustrative transport layer test sequence.

In particular, the present disclosure discusses an implementation for a transport layer test sequence generator, which is parameterizable, such that a single IP block may be parameterized for different specifications of the framer. The transport layer test sequence generator generates a transport layer test sequence according to, e.g., the Long Test Sequence identified in the JESD204B Specification, and the transport layer test sequence generator is adapted to replace one or more samples from the one or more data converters with a transport layer test sequence. The transport layer test sequence comprises sequence comprises at least one of: one or more converter identifiers, one or more sample identifiers, and a shifted pattern of control bits over the plurality of frame, as illustrated in FIG. 8. Furthermore, the transport layer test sequence should match with the specifications defined by the parameters of the framer.

Accordingly, the transport layer test sequence generator is configured according to a specification of the framer including at least one of: a number of bits per converter NP, a number of data converter(s) M, and a number of sample(s) per converter (per frame) S. It is noted that the instance parameter B (size of the input bus for "txdata") is directly related/derivable from M and S (and PF). Therefore, the transport layer test sequence generator may be synthesized according to B and NP (and optionally NP1, and NP2), to support the soft configuration/specification of the framer defined by NP, M, and S. While the transport layer test sequence could be hardcoded for a chosen specification of the framer, it is advantageous to generate a transport layer test sequence generator on programmable hardware, where the transport layer test sequence generator is configured to generate the test sequence during testing (without the need for hardcoding the sequence in a memory) based on the parameters provided for the generation of the framer. Such a test sequence generator obviates the need to hardcode the test sequence (and learn the test sequence specification).

Figure 9:
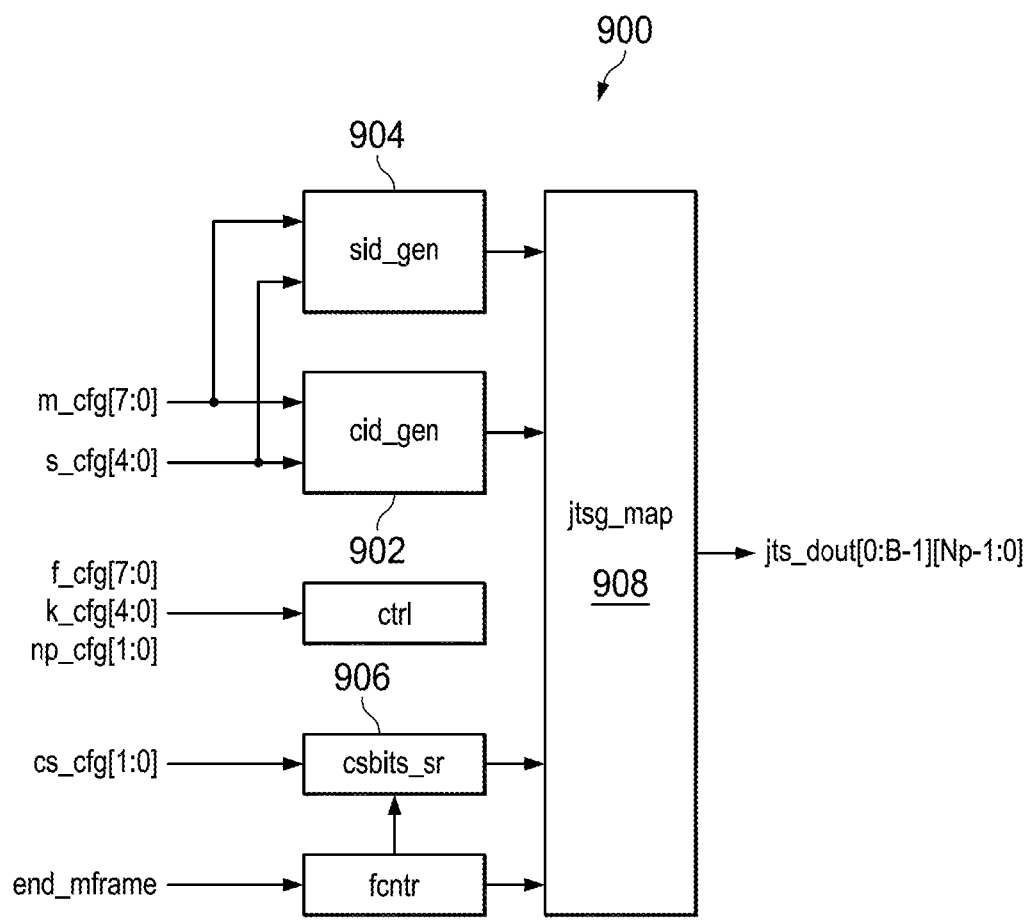
FIG. 9 shows a schematic diagram illustrating a transport layer test sequence generator, according to an embodiment of the disclosure.

FIG. 9 shows a schematic diagram illustrating a transport layer test sequence generator, according to an embodiment of the disclosure. A transport layer test sequence generator 900 includes, among other things, a converter identifier generator 902, a sample identifier generator 904, and a control bit shifter 906. A map 908 is configured to provide the one or more converter identifiers, the one or more sample identifiers, and the shifted pattern of control bits over the plurality of frames for output as the transport layer test sequence.

The converter identifier generator 902 is configured to generate the one or more converter identifiers (CID) from 1 and increment to the number of data converters(s) M, wherein the one or more converter identifiers are adapted to remain the same for the number of sample(s) per converter, and increment for each converter. The sample identifier generator 904 is configured to generate the one or more sample identifiers (SID), wherein the one or more sample identifiers increment from 1 and to the number of sample(s) for each converter(s) S per frame.

The following is an example for two converters with four samples per converter (M=2, and S=4):

| CID | 1 | 1 | 1 | 1 | 2 | 2 | 2 | 2 |
|-----|---|---|---|---|---|---|---|---|
| SID | 1 | 2 | 3 | 4 | 1 | 2 | 3 | 4 |

The control bit shifter 906 is configured to generate the shifted pattern of control bits of over the plurality of frames, wherein the control bits shifts in position for each frame. The shifted control bits/pattern is appended to M*S samples.

Figure 10:
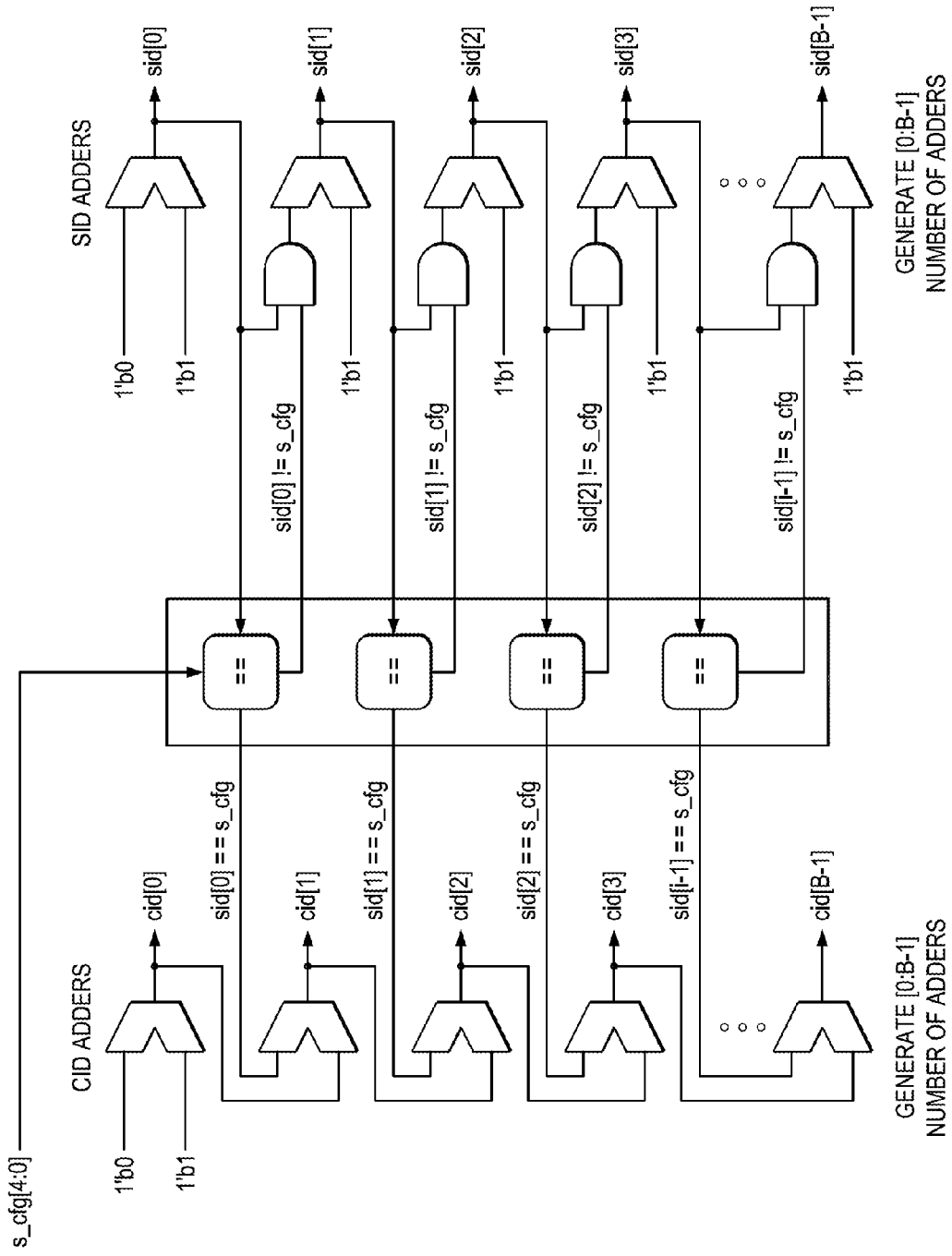
FIG. 10 shows a schematic diagram illustrating a converter identifier generator and a sample identifier generator, according to an embodiment of the disclosure.

FIG. 10 shows a schematic diagram illustrating a converter identifier generator and a sample identifier generator, according to an embodiment of the disclosure. The converter identifier generator and the sample identifier generator may be implemented from adder trees. The output of the adder in these adder trees connects to the input of the next adder. The instance parameter for generating the hardware of the framer B (the size of the input bus for providing the one or more samples to the transport layer) defines the number of adders in each tree. The number of samples per frame clock input "s_cfg" may be used for configuring feedback paths for each adder in the adder trees.

The converter identifier generator comprises a first adder tree having a first number of adders, the first number being an integer multiple of the product of number of bits per converter and the number of data converter(s). The CID remains unchanged for a group of converter samples. CID[0] starts at 1, the [s_cfg+1] is compared to each SID[i]. When equal, 1 is added to CID[i].

The sample identifier generator comprises a second adder tree having a second number of adders and comparators, the second number being an integer multiple of the product of number of bits per converter and the number of data converter(s). The SID is an incrementing pattern from 1 to [s_cfg+1]. The incrementing pattern is the same for each converter. SID[0] starts at 1. [s_cfg+1] is compared to each SID[i]. When not equal, SID[i] is 1 plus SID[i−1]. When equal, SID[i] is 1.

Figure 11:
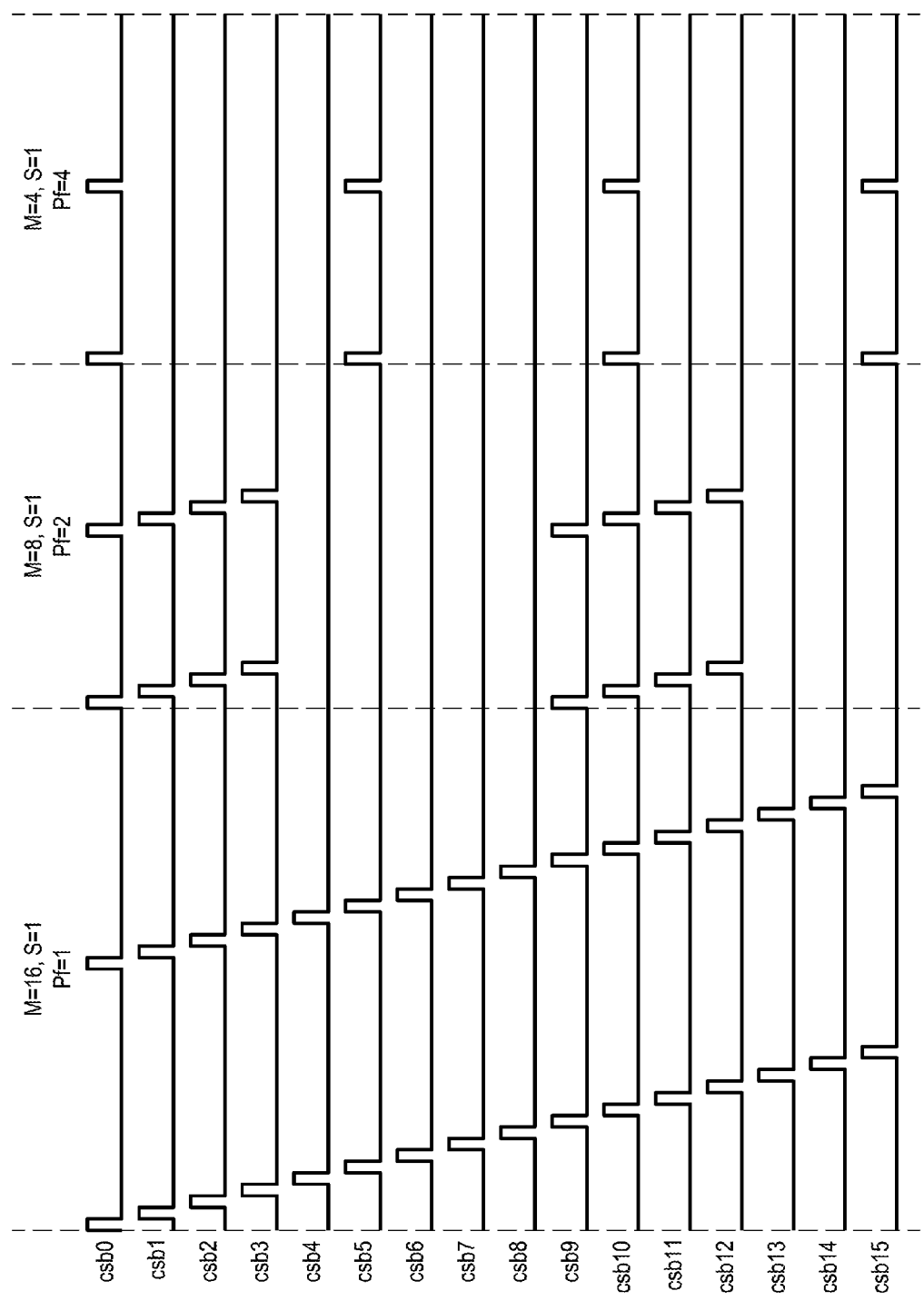
FIG. 11 shows an illustrative timing diagram depicting a control bit shift pattern, according to one embodiment of the disclosure.

FIG. 11 shows an illustrative timing diagram depicting a control bit shift pattern, according to one embodiment of the disclosure. The timing diagram shows a shift pattern example for PF=1, 2, and 4. When PF=1, the pattern is single bit shifting. When PF=2 (where two frames are being processed in parallel), the pattern is two bits shifting in parallel. When PF=4 (where four frames are being processed in parallel) the pattern is four bits shifting in parallel.

Figure 12:
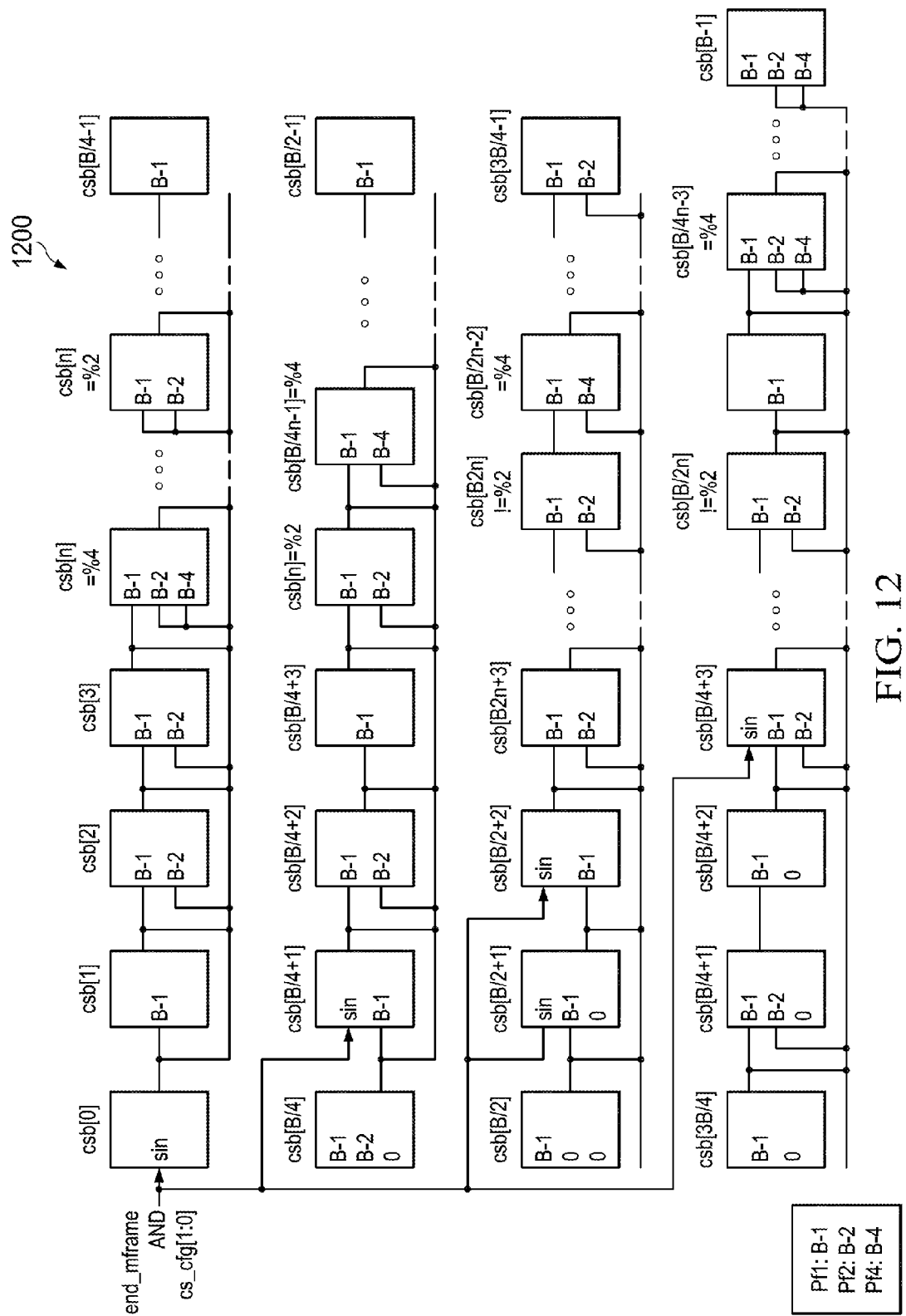
FIG. 12 shows a schematic diagram illustrating a control bit shifter, according to one embodiment of the disclosure.

FIG. 12 shows a schematic diagram illustrating a control bit shifter, according to one embodiment of the disclosure. The Instance Parameter B defines the length of the shift register, which makes up the control bit shifter 1200. The "f_cfg" (# of octets/frame, frame size F parameter) input defines the number of control bits shifting in parallel. The shift pattern starts on the first frame of the multiframe and continues shifting on end_frame until M*S samples are met.

The control bit shifter comprises a shift register having a length that is an integer (e.g., PF) multiple of the product of number of bits per converter and the number of data converter(s) (e.g., length is B, the size of the input bus "txdata"). The control bit shifter configuration is dependent on the number of frames the framer is processing (Pf is defined by "f_cfg" input). When Pf=1 the registers are organized as a 0 to B shift register. A single bit is shifted to the adjacent register each frame. When Pf=2 the registers are organized as two 0 to B/2 shift register stages that shift in parallel. Generally speaking, the shift register is divided into a number of parallel shift register stages, wherein the number of parallel shift register stages is the same as the number of frames the framer is configured to process in parallel. The 1st stage is 0 to B/2-1 and the 2nd stage is B/2 to B-1. A single bit in each stage is shifted to the 2nd adjacent register. The shift input for the 2nd stage is offset by one register. When Pf=4 the registers are organized as four 0 to B/4 shift register stages that shift in parallel. The stages are 0 to B/4-1, B/4 to B/2-1, B/2 to 3B/4-1 and 3B/4 to B-1. A single bit in each stage shifts to the 4th adjacent register each frame. The shift input is offset by one register in stage two, two registers in stage three and three registers in stage four. The shift pattern begins on the first frame of the multiframe and only if "cs_cfg">1. The end_mframe qualified with [cs_cfg>1] creates the shifter input.

Each register bit in the shift register has four inputs, B-1, B-2, B-4 and 0. Register input selection is done by a decoder, which uses "f_cfg", the instance parameter B, B/2 modulus, and B/4 modulus calculations to define the input select"csb_sel_in[i]" for each register. The input select configures the register bit to connect to the B-1, B-2 or the B-4 register.

Figure 13:
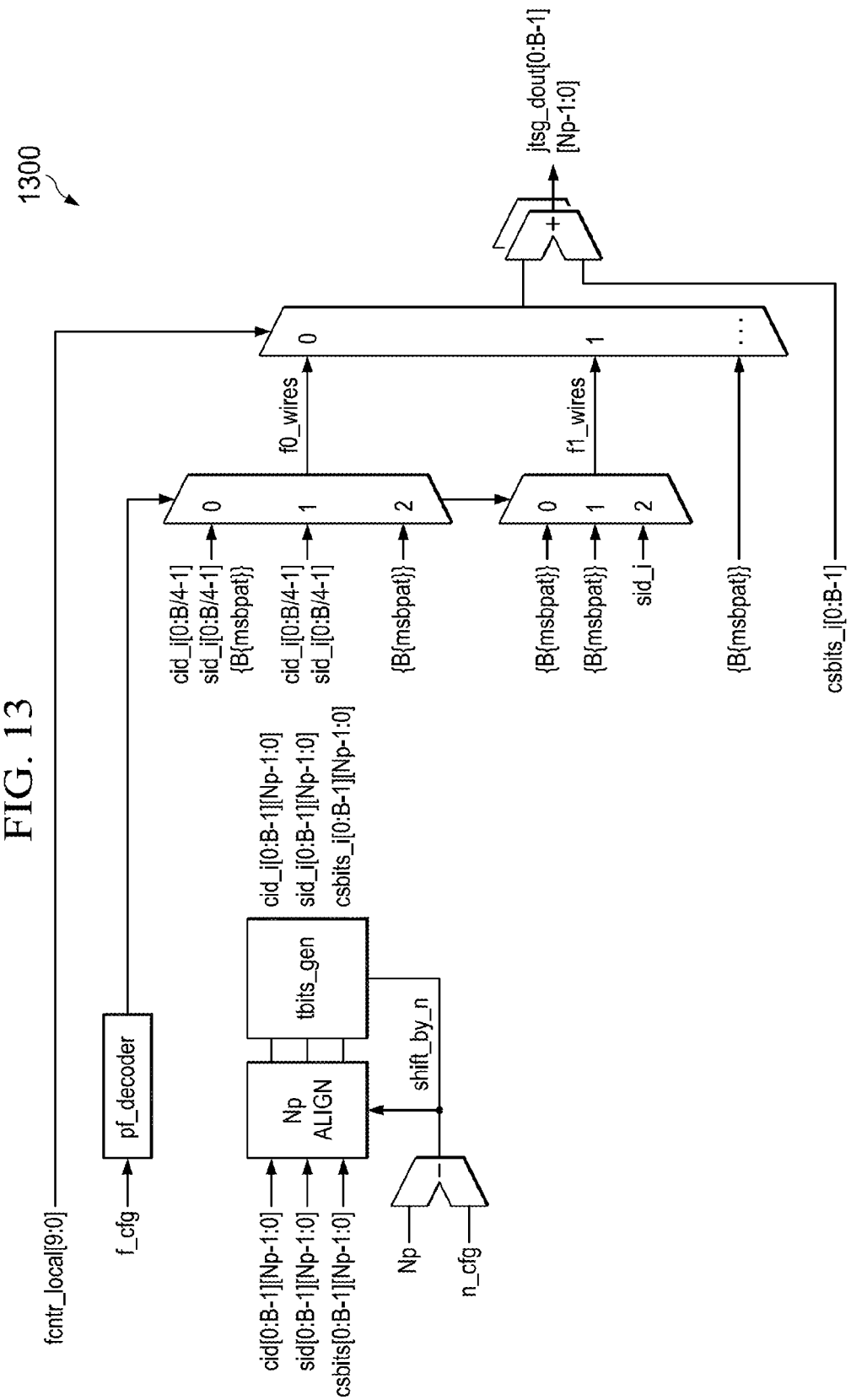
FIG. 13 shows a map for providing a transport layer test sequence, according to one embodiment of the disclosure.

FIG. 13 shows a map for providing a transport layer test sequence, according to one embodiment of the disclosure. The map 1300 is configured to map, e.g., the converter identifiers, the sample identifiers, and the control bits generated by converter identifier generator, the sample identifier generator, and the control bit shifter, respectively, to a transport layer test sequence for output. The map may be configured based on the number of frames processed in parallel (e.g., by "f_cfg").

When PF=1, CID pattern is sent in frame 0, SID pattern in frame 1 and MSB patterns in all other frames. The cs_bits pattern is appended to the output each frame by adding the cs_bits[ ] register. When PF=2 the CID and SID patterns are sent in frame 0 and MSB pattern is sent in all other frames. The cs_bits pattern is appended to every output. Generally, there are less M*S samples per JESD Frame when PF=2 compared to PF=1. When Pf=4 the CID, SID and MSB patterns are sent in frame 0. MSB patterns are sent in all other frames. The cs_bits pattern is appended to every output. In some embodiments, there are less M*S samples when PF=4 compared to PF=1 or 2. Test sequences are MSB Justified to the NP Instance Parameter. This is done by shifting the CID, SID and cs_bits patterns to the left [NP−n_cfg] times. Tail bits are appended to the as least significant bits (LSB) bits of CID and SID when [NP>N+CS], where NP is the total number of bits per converter sample, N is the number of bits per converter (converter resolution), and CS is the number of control bits per converter. In some embodiments, a parameter the CID, SID, control bits, and the MSB pattern is provided over a plurality of frames (e.g., a number of frames in a multiframe, as specified by a software configuration), and the sequence having the CID, SID, control bits and the MSB pattern would repeat for the next plurality of frames (e.g., for the next number of frames in the next multiframe).

Other Possible Parameters

While the generation of the hardware of the framer is performed based on parameters: B, NP, NP1, and NP2, other parameters may also be used to configure the hardware of the framer differently. For instance, parameters may be provided to reduce data link layer latency and/or frame memory latency. Certain pipelines may be removed and not synthesized in the framer. In another instance, a parameter may be used to remove the 8b10b encoder instantiations in the data link layer for each lane and inserts a pipeline register between the scrambler and the alignment character generation blocks. This is particular advantageous when providing the framer on a field-programmable gate array (FPGA), since the FPGA has its own 8b10b decoder macro and removing the 8b10b encoder in the data path improves the timing of the FPGA.

| Parameter | Description |
|---|---|
| RLDLK | Reduced Data Link Layer Latency. Removes 1-pclk pipeline from final QBF output.<br>1 = RTL will be synthesized in Reduced Latency mode (default)<br>In this mode, flip-flops are not synthesized at the final QBF output. 0 = In this mode, flip-flops are synthesized at the final QBF output. |
| RLFM | Reduced Frame Memory Latency. Removes 1-pclk pipeline between the frame memory and the data link.<br>(default = 0)<br>in this mode, flip-flops are inserted at fmem output.<br>1 = flip-flops are not inserted at fmem output |
| FPGA | 8b10b encoder excluded from QBF.<br>Inserts pipeline register between scrambler and ACG.<br>1 = RTL will be synthesized in FPGA mode 0 = RTL will be synthesized in ASIC mode (default)<br>In FPGA mode, - An extra pipeline (1 par_clk) is added between the scrambler and the ACG block. - The DesignWare 8b10b encoder is not synthesized; instead the 8x4-bit encoder input and 1x4 K character enable bits are made QBF outputs. The qbf_dout[0:L-1] outputs are redefined for sending 8b octets and kchar_ctrl for each octet in quad byte going to 8b10b encoder in FPGA. |

In the discussions of the embodiments above or embodiments shown through the FIGURES, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration/specification needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and digital-processing-based systems, or wherever a high speed serial data rate is desired for a particular ADC application.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations/specifications, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations/specifications. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. An apparatus for generating test sequences to allow verification of a framer, wherein the framer is configured to interface between one or more data converters and a logic device and to provide a plurality of frames to the logic device according to a serialized interface, the apparatus comprising:
 a transport layer test sequence generator on hardware configured to:
  generate a transport layer test sequence according to a specification of the framer, wherein the specification includes a number of bits per converter, a number of data converter(s), and a number of sample(s) per converter per frame, and the transport layer test sequence comprises one or more converter identifiers, one or more sample identifiers, and a shifted pattern of control bits over the plurality of frames; and
  replace one or more samples from the one or more data converters with the transport layer test sequence;
 wherein the transport layer test sequence generator is synthesized to hardware based on the specification of the framer.

2. The apparatus of claim 1, wherein the transport layer test sequence generator comprises:
 a converter identifier generator configured to generate the one or more converter identifiers from 1 and increment to the number of data converters(s), wherein the one or more converter identifiers are configured to remain the same for the number of sample(s) per converter, and increment for each converter.

3. The apparatus of claim 2, wherein:
 the converter identifier generator comprises a first adder tree having a first number of adders, the first number being an integer multiple of the product of number of bits per converter and the number of data converter(s).

4. The apparatus of claim 1, wherein the transport layer test sequence generator comprises:
 a sample identifier generator configured to generate the one or more sample identifiers, wherein the one or more sample identifiers increment from 1 and to the number of sample(s) for each converter(s) per frame.

5. The apparatus of claim 4, wherein:
 the sample identifier generator comprises a second adder tree having a second number of adders and comparators, the second number being an integer multiple of the product of number of bits per converter and the number of data converter(s).

6. The apparatus of claim 1, wherein the transport layer test sequence generator further comprises:
 a control bit shifter configured to generate the shifted pattern of control bits of over the plurality of frames, wherein the control bits shifts in position for each frame.

7. The apparatus of claim 6, wherein:
 the control bit shifter comprises a shift register having a length that is an integer multiple of the product of number of bits per converter and the number of data converter(s).

8. The apparatus of claim 7, wherein:
 the shift register is divided into a number of parallel shift register stages, wherein the number of parallel shift register stages is the same as a number of frames the framer is configured to process in parallel.

9. The apparatus of claim 1, wherein:
 the transport layer test sequence generator further comprises a map configured to provide the one or more converter identifiers, the one or more sample identifiers, and the shifted pattern of control bits over the plurality of frames for output as the transport layer test sequence.

10. The apparatus of claim 1, wherein:
 the transport layer test sequence comprises the Long Test Sequence defined in the JESD204B Specification by the JEDEC Solid State Technology Association.

11. A method for generating test sequences to allow verification of a framer wherein the framer is configured to interface between one or more data converters and a logic device and to provide a plurality of frames to the logic device according to a serialized interface, the method comprising:
 generating, by a transport layer test sequence generator, a first transport layer test sequence according to a first specification of the framer, wherein the first specification includes a number of bits per converter, a number of data converter(s), and a number of sample(s) per converter per frame, and the transport layer test sequence comprises one or more converter identifiers, one or more sample identifiers, and a shifted pattern of control bits over the plurality of frames; and
 replacing one or more samples from the one or more data converters with the transport layer test sequence;
 wherein the transport layer test sequence generator is configurable based on a second specification of the framer different from the first specification of the framer to generate a second transport layer test sequence according to the second specification.

12. The method according to claim 11, wherein generating a transport layer test sequence comprises:
 generating, by a converter identifier generator, the one or more converter identifiers from 1 and increment to the number of data converters(s), wherein the one or more converter identifiers are configured to remain the same for the number of sample(s) per converter per frame, and increment for each converter;
 wherein the converter identifier generator comprises a first adder tree having a first number of adders, the first number being an integer multiple of the product of number of bits per converter and the number of data converter(s).

13. The method according to claim 11, wherein generating a transport layer test sequence comprises:
 generating, by a sample identifier generator, the one or more sample identifiers, wherein the one or more sample identifiers increment from 1 and to the number of samples(s) for each converter(s) per frame; and
 wherein the sample identifier generator comprises a second adder tree having a second number of adders and comparators, the second number being an integer multiple of the product of number of bits per converter and the number of data converter(s).

14. The method of claim 11, wherein generating a transport layer test sequence comprises:
   generating, by a control bit shifter, the shifted pattern of control bits of over the plurality of frames, wherein the control bits shifts in position for each frame; and
   wherein the control bit shifter comprises a shift register having a length that is an integer multiple of the product of number of bits per converter and the number of data converter(s).

15. One or more non-transitory tangible media that includes code for execution and when executed by a processor is operable to perform operations to synthesize an apparatus for generating test sequences to allow verification of a framer, wherein the framer is configured to interface between one or more data converters and a logic device and to provide a plurality of frames to the logic device according to a serialized interface, the operations comprising:
   receiving a specification of the framer including: a number of bits per converter, a number of data converter(s), and a number of sample(s) per converter per frame; and
   synthesizing programmable hardware comprising a transport layer test sequence generator configured to replace one or more samples from the one or more data converters with a transport layer test sequence generated according to the specification of the framer, wherein the transport layer test sequence comprises one or more converter identifiers, one or more sample identifiers, and a shifted pattern of control bits over the plurality of frames.

16. The media of claim 15, wherein the transport layer test sequence generator comprises:
   a converter identifier generator configured to generate the one or more converter identifiers from 1 and increment to the number of data converters(s), wherein the one or more converter identifiers are configured to remain the same for the number of sample(s) per converter per frame, and increment for each converter;
   wherein the converter identifier generator comprises a first adder tree having a first number of adders, the first number being an integer multiple of the product of number of bits per converter and the number of data converter(s).

17. The media of claim 15, wherein the transport layer test sequence generator comprises:
   a sample identifier generator configured to generate the one or more sample identifiers, wherein the one or more sample identifiers increment from 1 and to the number of sample(s) for each converter(s) per frame; and
   wherein the sample identifier generator comprises a second adder tree having a second number of adders and comparators, the second number being an integer multiple of the product of number of bits per converter and the number of data converter(s).

18. The media of claim 15, wherein the transport layer test sequence generator comprises:
   a control bit shifter configured to generate the shifted pattern of control bits of over the plurality of frames, wherein the control bits shifts in position for each frame; and
   wherein the control bit shifter comprises a shift register having a length that is an integer multiple of the product of number of bits per converter and the number of data converter(s).

19. The media of claim 15, wherein the transport layer test sequence generator comprises:
   a map configured to provide the one or more converter identifiers, the one or more sample identifiers, and the shifted pattern of control bits over the plurality of frames for output as the transport layer test sequence.

20. The media of claim 15, wherein programmable hardware is a field-programmable gate array and/or an application specific integrated circuit.

* * * * *

UNITED STATES PATENT AND TRADEMARK OFFICE
CERTIFICATE OF CORRECTION

| | | |
|---|---|---|
| PATENT NO. | : 9,143,423 B2 | Page 1 of 1 |
| APPLICATION NO. | : 13/938030 | |
| DATED | : September 22, 2015 | |
| INVENTOR(S) | : Kenneth J. Keyes, Jr. | |

It is certified that error appears in the above-identified patent and that said Letters Patent is hereby corrected as shown below:

On The Title Page, Items (12) and (72) Inventor: delete "Keys" and insert -- "Keyes" --, therefor.

Signed and Sealed this
Twenty-sixth Day of January, 2016

Michelle K. Lee
*Director of the United States Patent and Trademark Office*